(12) United States Patent  
Sawamura

(10) Patent No.: US 7,913,138 B2
(45) Date of Patent: Mar. 22, 2011

(54) SEMICONDUCTOR INTEGRATED CIRCUIT

(75) Inventor: Takahiro Sawamura, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 196 days.

(21) Appl. No.: 12/396,745

(22) Filed: Mar. 3, 2009

(65) Prior Publication Data

US 2009/0228752 A1   Sep. 10, 2009

(30) Foreign Application Priority Data

Mar. 5, 2008   (JP) .................................. 2008-054413

(51) Int. Cl.
*G01R 31/28* (2006.01)
(52) U.S. Cl. ........................ 714/731; 714/744
(58) Field of Classification Search .................. 327/141; 365/49.17; 714/30, 700, 724, 731, 744
See application file for complete search history.

(56) References Cited

U.S. PATENT DOCUMENTS

| 5,566,300 | A  | * | 10/1996 | Naoe ................................. 714/30 |
| 6,489,819 | B1 | * | 12/2002 | Kono et al. ....................... 327/141 |
| 6,944,039 | B1 | * | 9/2005  | Nataraj et al. ................ 365/49.17 |
| 7,102,959 | B2 | * | 9/2006  | Inuzuka et al. ................... 365/191 |
| 7,334,168 | B2 | * | 2/2008  | Kai et al. .......................... 714/700 |
| 7,480,841 | B2 | * | 1/2009  | Kai et al. .......................... 714/724 |

FOREIGN PATENT DOCUMENTS

JP    2006-004509 A    1/2006

* cited by examiner

*Primary Examiner* — David Ton
(74) *Attorney, Agent, or Firm* — Arent Fox LLP

(57) ABSTRACT

A semiconductor integrated circuit, including a data input unit for receiving an input data signal to be supplied to an external data input terminal, a storage unit for storing the input data signal received by the data input unit, a timing generating unit for generating a timing signal in response to an output request signal, a data output unit for outputting, in synchronization with the timing signal, the input data signal stored in the storage unit as an output data signal, a test output control unit for outputting, in synchronization with the timing signal, and a data selector for outputting the output data signal supplied from the data output unit to the external data output terminal in a normal operation mode and outputting the input data signal supplied from the test output control unit to the external data output terminal in a test mode.

10 Claims, 17 Drawing Sheets

SEMICONDUCTOR INTEGRATED CIRCUIT

CROSS-REFERENCE TO RELATED APPLICATIONS

This application is based upon and claims the benefit of priority from prior Japanese Patent Application No. 2008-54413 filed on Mar. 5, 2008, the entire contents of which are incorporated herein by reference.

BACKGROUND

1. Field

Aspects of the present invention relate to semiconductor integrated circuits having a test function.

2. Description of Related Art

The structure of semiconductor devices, such as transistors, has been miniaturized and the degree of integration of circuits mounted on one chip has been increasing. Accordingly, a system large-scale integrated circuit (LSI) that realizes functions of a system with one chip has been developed. Generally, a system LSI has a function block (hard macro), such as a memory and a controller, and a user block (user logic) connected to the function block in order to realize functions unique to a user.

An amount of time for testing a system LSI increases in proportion to an increase in the number of logic gates. Such an increase in time leads to an increase in the test cost. Japanese Patent Laid-Open No. 2006-4509 discloses various testing methods for reducing the test cost. To test a user block designed uniquely to a user (to detect a stuck-at fault), a scan path test using daisy-chained flip-flops has been proposed. In addition, to test a function block, such as a memory macro, a method for including a built-in self test (BIST) circuit in a system LSI has been proposed. As described above, an improvement in the efficiency of the test of the user block and the test of the function block is attempted independently.

SUMMARY

According to aspects of an embodiment, a semiconductor integrated circuit includes: a data input unit for receiving an input data signal to be supplied to an external data input terminal; a storage unit for storing the input data signal received by the data input unit; a timing generating unit for generating a timing signal in response to an output request signal; a data output unit for outputting, in synchronization with the timing signal, the input data signal stored in the storage unit as an output data signal; a test output control unit for outputting, in synchronization with the timing signal, the input data signal received by the data input unit; and a data selector for outputting the output data signal supplied from the data output unit to the external data output terminal in a normal operation mode and outputting the input data signal supplied from the test output control unit to the external data output terminal in a test mode.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF THE PREFERRED EMBODIMENTS

Figure 1:
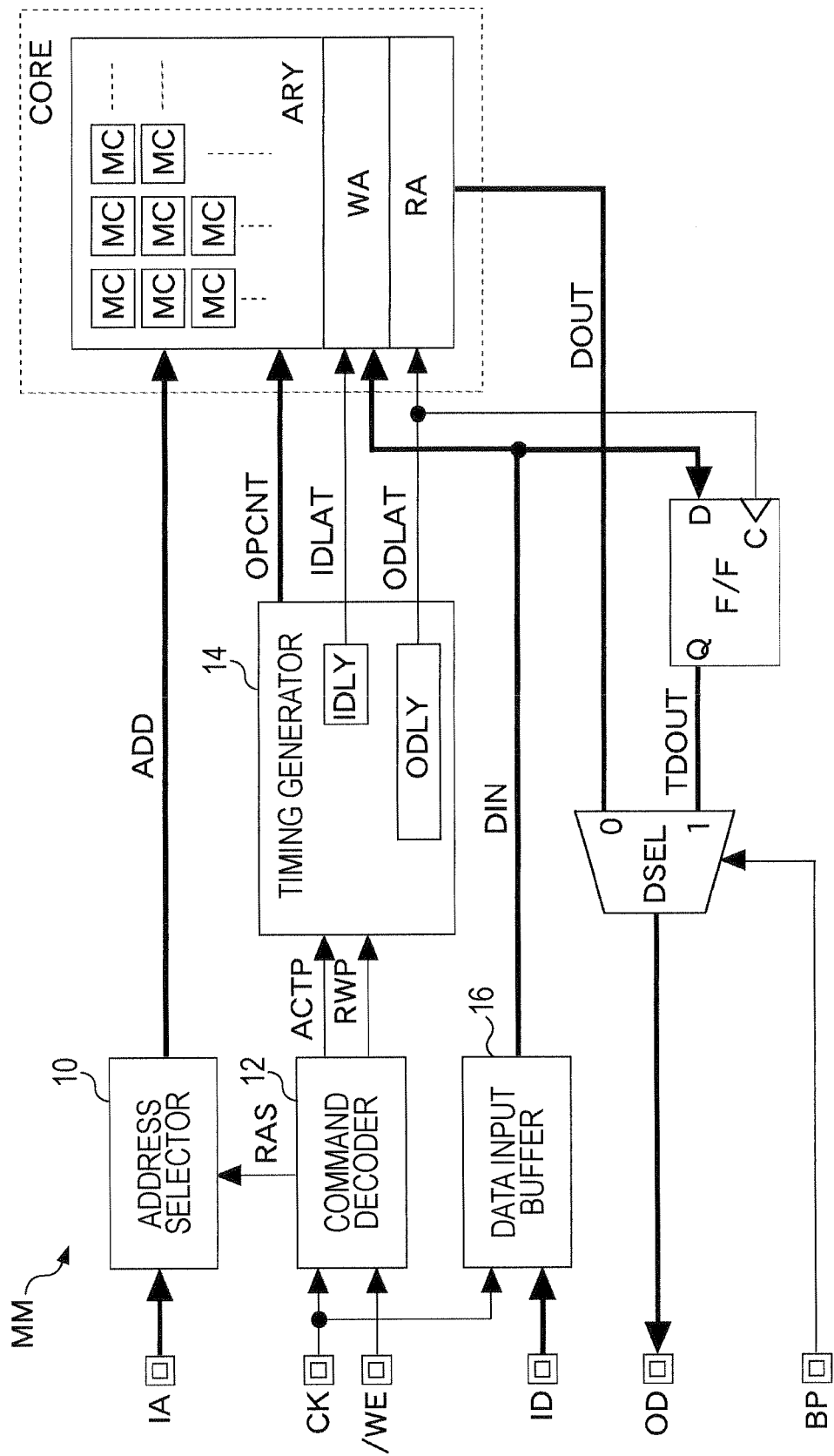
FIG. 1 shows a memory macro according to aspects of one embodiment.

Aspects of certain embodiments will be described below using the accompanying drawings. A thick line indicates a plurality of signal lines in the drawings. In addition, some of blocks connected to a thick line may have a plurality of circuits. The same reference as a name of a signal is used to represent a signal line that the signal propagates through. A signal having a name starting from "/" indicates a negative logic signal. A doubled-lined rectangle represents an external terminal in the drawings. The external terminal may be, for example, a terminal of a hard macro, a pad mounted on a semiconductor chip, or a lead of a package storing a semiconductor chip. The same reference as a name of an external terminal is used to represent a signal to be supplied through the external terminal.

Figure 2:
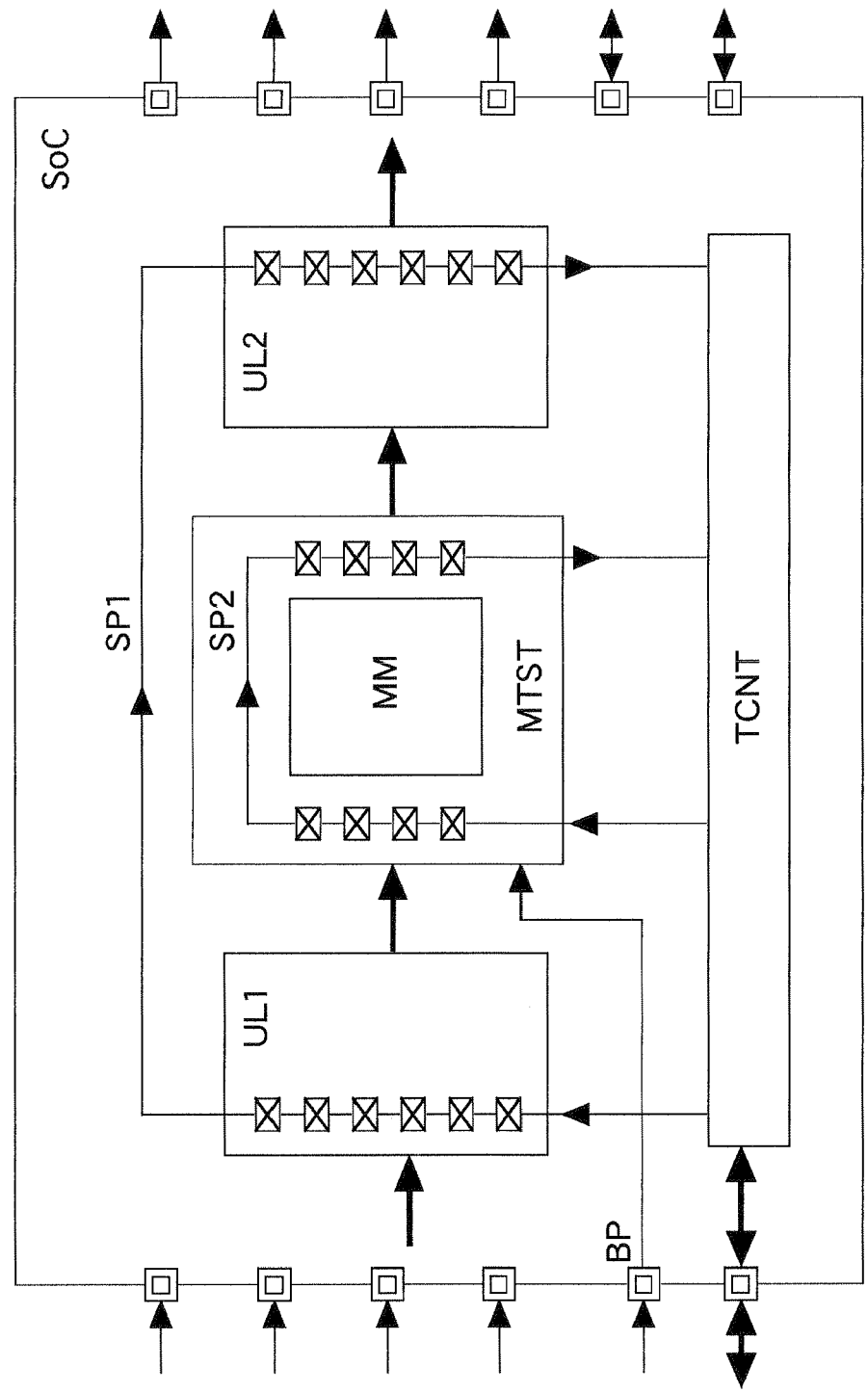
FIG. 2 shows an example of a system on which the memory macro shown in FIG. 1 is mounted.

FIG. 1 shows a memory macro MM according to one embodiment. For example, the memory macro MM is designed as a hard macro (function block). As shown in FIG. 2, the memory macro MM and user logic units UL1 and IL2 are mounted on a system SYS (semiconductor integrated circuit chip). The memory macro MM includes an address selector 10, a command decoder 12, a timing generator 14, a data input buffer 16, a flip-flop F/F, a data selector DSEL, and a memory core CORE.

The address selector 10 receives an input address signal IA in synchronization with a timing signal RAS. The address selector 10 outputs the input address signal IA to the memory core CORE as an internal address signal ADD. The address selector 10 may have a function for decoding the address signal IA (a function of an address decoder). In this case, the internal address signal ADD is a decoded address signal. The address decoder may be provided in the memory core CORE. In addition, the address selector 10 may receive the input address signal IA through an address buffer that operates in synchronization with a clock signal CK.

The command decoder 12 receives, in synchronization with the clock signal CK, a write enable signal /WE. The command decoder 12 outputs, in synchronization with the timing signal RAS, an active signal ACTP and a read/write control signal RWP. More specifically, the memory macro MM executes, for each cycle of the clock signal CK, a write operation or a read operation. The active signal ACTP is a high-level pulse signal. The read/write control signal RWP is changed to a high level in response to a write command and to a low level in response to a read command.

A clock enable signal CKE, not shown, may be supplied to the memory macro MM and the command decoder 12 may operate while the level of the clock enable signal CKE is high. In this case, the command decoder 12 stops outputting the timing signal RAS, the active signal ACTP, and the read/write control signal RWP while the level of the clock enable signal CKE is low. More specifically, the signals RAS, ACTP, and RWP are kept at the low level while the level of the clock enable signal CKE is low. The memory macro MM executes, for each cycle of the clock signal CK, a write operation or a read operation while the level of the clock enable signal CKE is high. While the level of the clock enable signal CKE is low, the memory macro MM is set in a standby state and is prohibited from executing a write operation and a read operation.

The timing generating unit 14 has delay circuits IDLY and ODLY for outputting an input data latch signal IDLAT and an output data latch signal ODLAT (timing signals), respectively. The lengths of rectangular frames representing the delay circuits IDLY and ODLY indicate relative delay time lengths. When the level of the write enable signal /WE is low, the delay circuit IDLY delays the active signal ACTP for a predetermined period and outputs the active signal ACTP as the input data latch signal IDLAT. When the level of the write enable signal /WE is high, the delay circuit ODLY delays the active signal ACTP for a predetermined period and outputs the active signal ACTP as the output data latch signal ODLAT. The high-level active signal ACTP and the low-level write enable signal /WE indicate a write command (input request signal). The high-level active signal ACTP and the high-level write enable signal /WE indicate a read command (output request signal). The timing generator 14 also outputs, in accordance with the active signal ACTP and the read/write control signal RWP, an operation control signal OPCNT (a word line activation signal or a bit line pre-charge stop signal) for operating a memory cell array ARY.

The data input buffer 16 (data input unit) receives, in synchronization with the clock signal CK, an input data signal ID (write data) with an external data input terminal ID and outputs the received signal as an internal input data signal DIN.

The flip-flop F/F (test output control unit) latches, in synchronization with the output data latch signal ODLAT, a logic level of the internal input data signal DIN having received by the data input buffer 16 and outputs the logic level as a test output data signal TDOUT. The flip-flop F/F latches at least one bit of the internal input data signal DIN composed of a plurality of bits. The flip-flop F/F may operate in response to the output data latch signal ODLAT only during a test mode. The power consumption can be reduced by prohibiting input of the output data latch signal ODLAT during the normal operation mode.

When the level of a bypass mode signal BP is low ("0"), the data selector DSEL outputs an output data signal DOUT (read data) supplied from a read amplifier RA to an external data output terminal OD. When the level of the bypass mode signal BP is high ("1") (i.e., during a test mode), the data selector DSEL outputs the test output data signal TDOUT (i.e., internal input data signal DIN) supplied from the flip-flop F/F to the external data output terminal OD. The bypass mode signal BP is set to be high at the time of execution of a bypass test, which will be described later. When the flip-flop F/F receives one bit of the internal input data signal DIN, the data selector DSEL receives one bit of the corresponding output data signal DOUT and the test output data signal TDOUT (one bit). In this case, the other bits of the output data signal DOUT are not supplied to the data selector DSEL but are directly supplied to the external data output terminal OD.

The memory core CORE has a memory cell array ARY (storage unit), a write amplifier WA, and the read amplifier RA. The memory cell array ARY has a plurality of memory cells MC that is arranged in a matrix form and holds the input data signal ID. For example, each of the memory cells MC has a latch. The memory cell array ARY operates as a static random access memory (SRAM). Although not shown in the drawing, the memory cell array ARY has, for example, word lines each connected to a respective row of the memory cells MC arranged in the horizontal direction in the drawing and bit lines each connected to a respective column of the memory cells MC arranged in the vertical direction in the drawing. A sense amplifier for amplifying a data signal read out from the memory cell MC through the bit line may be formed at an end of the memory cell array ARY (on the upper or lower side in the drawing).

The memory cell array ARY starts operating in accordance with an operation control signal OPCNT output from the timing generator 14 in response to a read command. More specifically, the memory cell array ARY stops pre-charging of the bit lines in response to the operation control signal OPCNT, activates a word line selected by the address signal ADD, and outputs data stored in the memory cell MC that is connected to the activated word line to the bit line. The data signal output to the bit line is transferred to the read amplifier RA. The memory cell array ARY operates in accordance with the operation control signal OPCNT asynchronously with the clock signal CK. Accordingly, an operation performed between reception of the read command and output of the read data from the read amplifier RA is performed asynchronously with the clock signal CK.

The write amplifier WA latches, in synchronization with the input data latch signal IDLAT, a logic level of the internal input data signal DIN and writes the latched signal in the memory cells MC. The read amplifier RA (data output unit) amplifies an output data signal read out from the memory cell MC, latches and stores a logic level of the amplified signal in synchronization with the output data latch signal ODLAT, and outputs the stored signal as the output data signal DOUT. When the memory cell array ARY has a sense amplifier, the sense amplifier amplifies a voltage value of the data signal read output from the memory cell MC to the bit line. The read amplifier RA, in turn, amplifies the signal level (drive capability) of the data signal supplied from the sense amplifier in order to output the data signal having a large load to the output data signal line DOUT.

Figure 5:
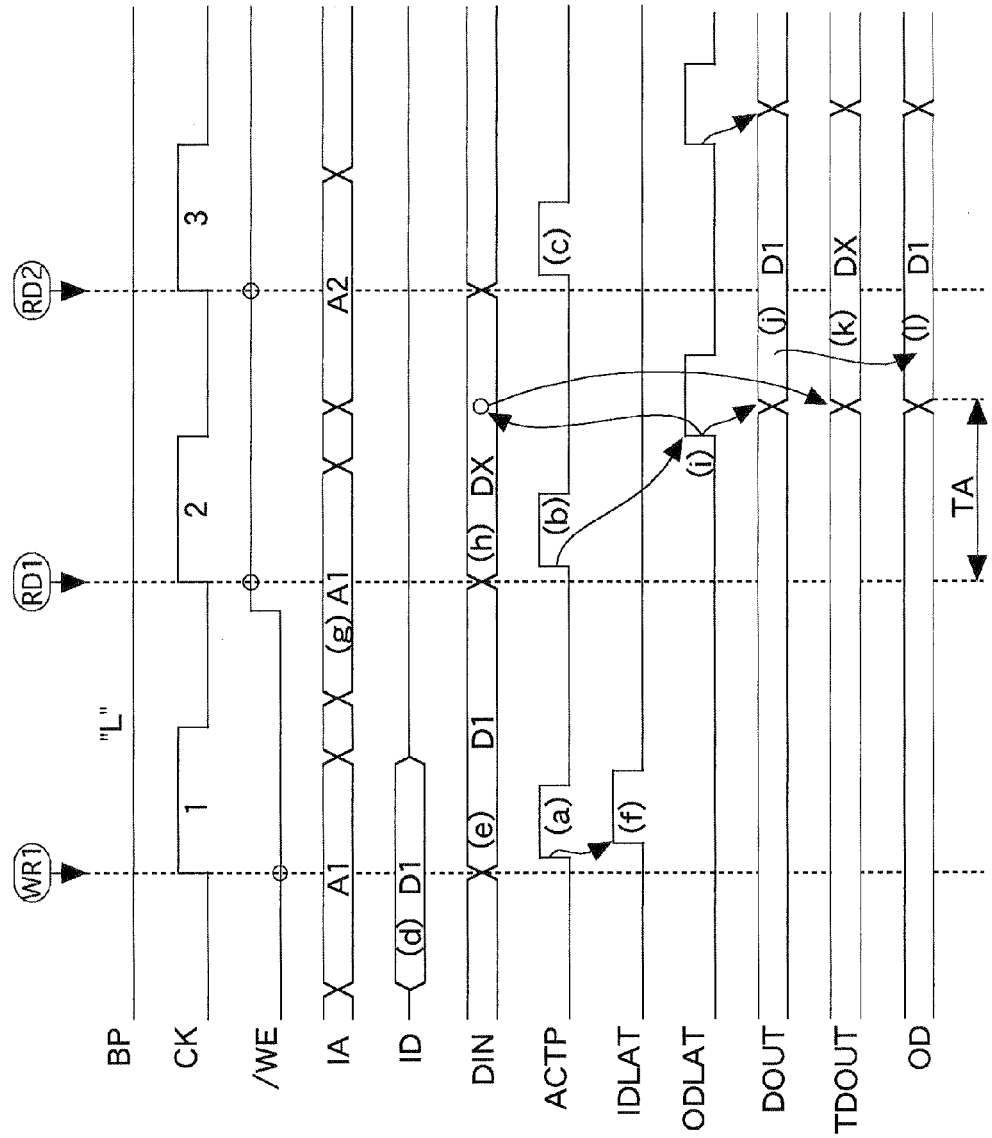
FIG. 5 shows an operation of the memory macro shown in FIG. 1 performed in a normal operation mode.
Figure 6:
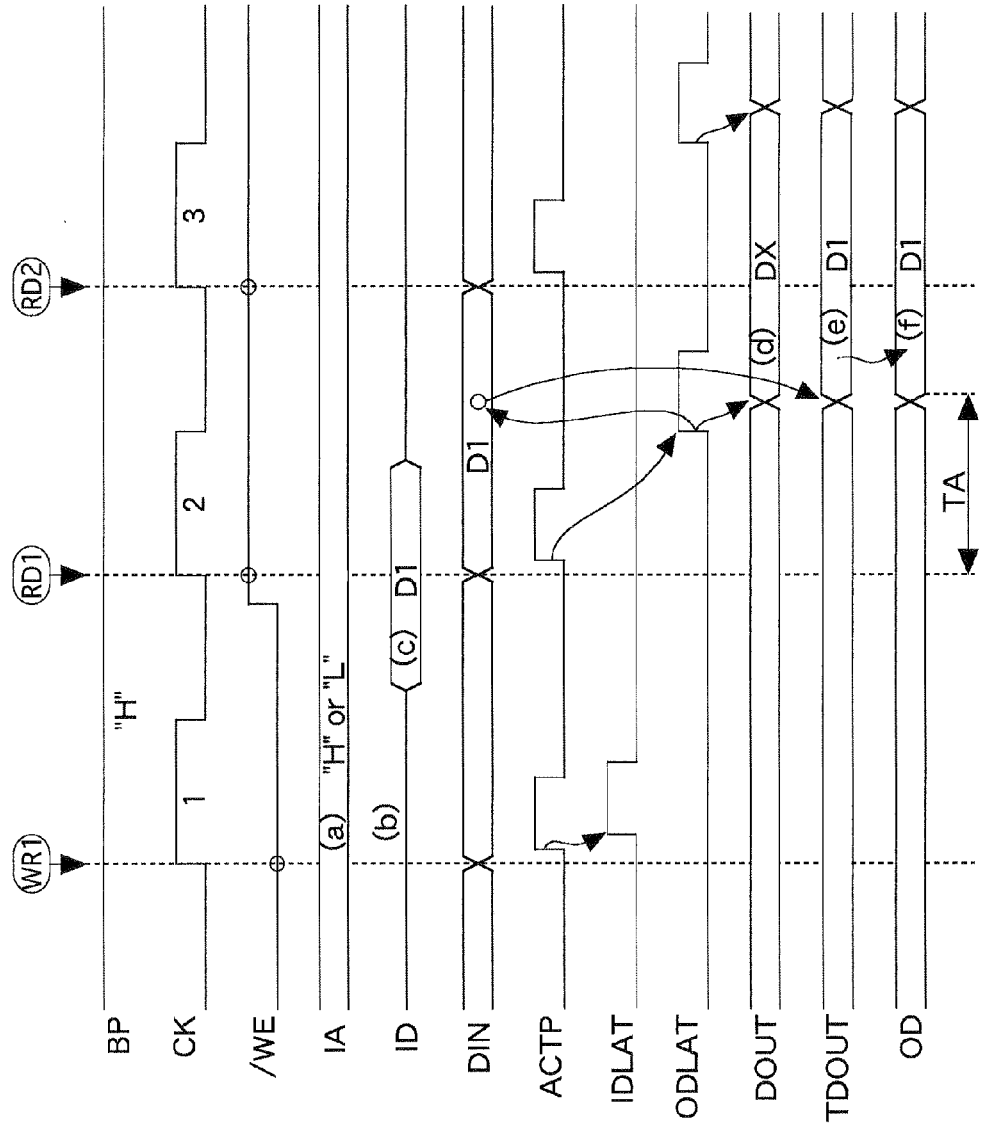
FIG. 6 shows an operation of a memory macro performed to test the user logic circuit L4 in a logic test mode.

In this embodiment, for example, the load of an output data signal line TDOUT (test signal line) that transfers the output data signal TDOUT (i.e., the input data signal DIN) from the flip-flop F/F to the data selector DSEL is designed to be equal to the load of an output data signal line DOUT (normal line) that transfers the output data signal DOUT from the read amplifier RA to the data selector DSEL. For example, the signal lines TDOUT and DOUT have the same structure and the lengths thereof are equal. With such a configuration, the timing of the test output data signal TDOUT arriving at the data selector DSEL can be set equal to the timing of the output data signal DOUT arriving at the data selector DSEL. Accordingly, as shown in FIGS. 5 and 6, an identical access time TA (operation timing) of the memory macro MM can be set in the user mode (normal operation mode) and the logic test mode. That is, the memory macro MM can be operated in a simulated manner using simple test patterns.

FIG. 2 shows an example of a system SYS on which the memory macro MM shown in FIG. 1 is mounted. For example, the system SYS is formed in one chip (semiconductor integrated circuit) as a system on chip SoC (system LSI). The system SYS has user logic units UL1 and UL2 (user blocks), the memory macro MM, a memory test unit MTST, and a test control unit TCNT. FIG. 2 shows aspects of a minimum configuration of the embodiment. In addition to a configuration shown in FIG. 2, the SoC may include other hard macros, such as a central processing unit (CPU), a direct memory access controller (DMAC), and a memory controller.

The user logic units UL1 and UL2 are logic circuits designed uniquely for a user. Each of the user logic units UL1 and UL2 has a plurality of daisy-chained scan registers (represented by rectangles with "x"). Each scan register includes a flip-flop. The flip-flops are connected to a scan path SP1 and sequentially transfer serial test data output from the test control unit TCNT during a test mode. A user circuit designed by a user may be used as the flip-flops or the flip-flops may be included in the user logic units UL1 and UL2 as test circuits.

The memory test unit MTST includes control circuits (PATG and CHK shown in FIG. 3) for testing the memory macro MM and a plurality of daisy-chained scan registers (represented by rectangles with x) for testing the user logic units UL1 and UL2. Flip-flops of the scan registers are connected to a scan path SP2 and sequentially transfer serial test data output from the test control unit TCNT during the test mode. The scan paths SP1 and SP2 may be connected in series.

The test control unit TCNT has a control circuit for testing the user logic units UL1 and UL2. For example, during a logic test mode for testing the user logic units UL1 and UL2, the test control unit TCNT receives signals /WE, IA, and ID, stored in output registers REG4-REG6 shown in FIG. 3, through the scan path SP2. The test control unit TCNT detects a defect of the user logic unit UL1 by comparing the received signal values with expected values. During the logic test mode, the test control unit TCNT also sets test input data signals in input registers REG1-REG3 shown in FIG. 3 through the scan path SP1. During the logic test mode, the test control unit TCNT receives a user output signal OD0, stored in an output register REG8 shown in FIG. 3, through the scan path SP1 and detects a defect of the user logic unit UL2 by comparing the received signal value with an expected value. During the logic test mode, the test control unit TCNT can detect a defect of the memory macro MM by receiving a data output signal OD, stored in a register REG7 shown in FIG. 3, through the scan path SP2.

In this example, the bypass mode signal BP is supplied from outside of the SoC. The bypass mode signal BP is used only when the SOC is tested. More specifically, the bypass mode signal BP is output from a test system, such as an LSI tester, or a function block (macro) test control circuit included in the system SYS along with the SoC. The SoC is tested in the process of manufacture of the SoC. By selecting defect-free products, the SoC is manufactured. The test of the SoC may be performed on the system SYS after the SoC is mounted on the system SYS. After the completion of the test, a bypass mode terminal BP is connected to, for example, a ground line on a system substrate.

Figure 3:
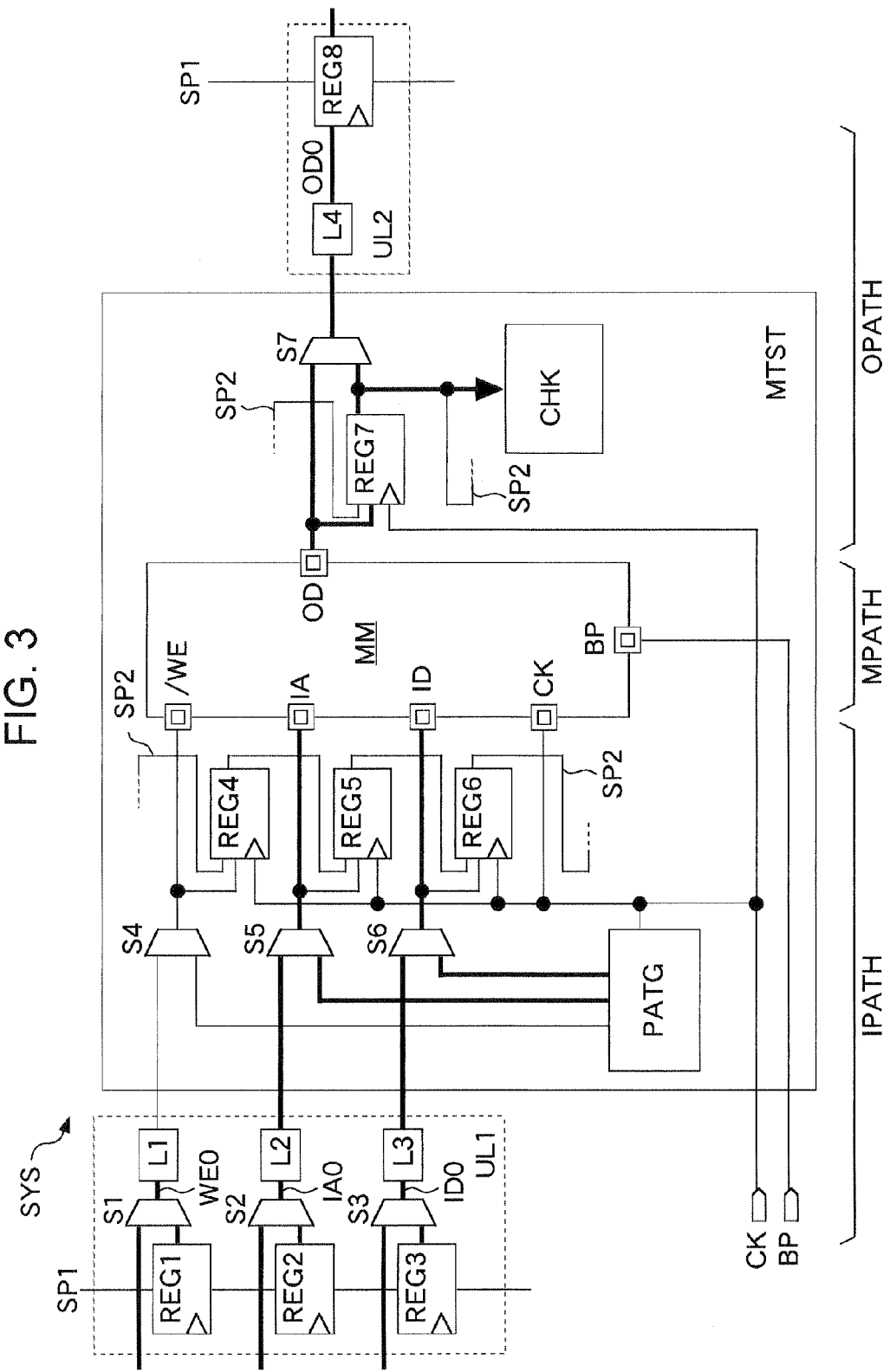
FIG. 3 shows a detailed view of major parts of the system shown in FIG. 2.

FIG. 3 shows a detailed view of major parts of the system SYS shown in FIG. 2. The user logic unit UL1 has the scan registers REG1-REG3 connected to the scan path SP1, selectors S1-S3, and user logic circuits (input user logic circuits) L1-L3. Although connections between the registers REG1-REG3 and the scan path SP1 are simplified in the drawing, the registers REG1-REG3 are connected in series through the scan path SP1 as in the case of the registers REG4-REG6 of the memory test unit MTST. As in the case of the registers REG4-REG6 (FIG. 4), each of the registers REG1-REG3 has a scan multiplexer and a flip-flop.

The registers REG1-REG3 (input registers) are used to store test input signals (test patterns) during a test of the user logic circuits L1-L3, respectively. More specifically, during a logic test mode, the register REG1 operates as a test circuit that stores and outputs a logic level of a control signal WE0 to generate the write enable signal /WE using the user logic circuit L1. The register REG2 operates as a test circuit that stores and outputs a logic level of a control signal IA0 to generate the address signal IA using the user logic circuit L2. The register REG3 operates as a test circuit that stores and outputs a logic level of a control signal ID0 to generate the data signal ID using the user logic circuit L3. For example, during the logic test mode, the user logic circuit L3 operates in response to the test input signal (ID0) supplied from the register REG3 to generates the input data signal ID, and outputs the generated input data signal ID to an external data input terminal ID through a selector S6.

The logic levels stored in the registers REG1-REG3 may be directly supplied to the external input terminal of the memory macro MM instead of supplying them through the user logic circuits L1-L3, respectively. In this case, a user logic circuit L4 can be tested by directly supplying the signal values stored in the registers REG1-REG3 to the memory macro MM. The selectors S1-S3 select the outputs of the registers REG1-REG3 during the logic test mode and select outputs of other circuits, not shown, during a normal operation mode. The user logic circuits L1-L3 may receive signals other than signals WE0, IA0, and ID0 supplied from the registers REG1-REG3, respectively.

The memory test unit MTST (BIST circuit) has the pattern generating circuit PATG, selectors S4-S7, the scan registers REG4-REG7, and the check circuit CHK. The pattern generating circuit PATG generates a test pattern for testing the memory macro MM. More specifically, during a macro test mode, the pattern generating circuit PATG generates, as a test pattern, the write enable signal /WE, the address signal IA, and the write data signal ID.

During the normal operation mode or the logic test mode, the selectors S4-S7 supply the signals fed from the user logic unit UL1 to the memory macro MM. During the macro test mode for testing the memory macro MM, the selectors S4-S7 supply a test pattern fed from the pattern generating circuit PATG to the memory macro MM.

The registers REG4-REG7 are connected to the scan path SP2. During the logic test mode, the registers REG4-REG6 store output signals supplied from the user logic unit UL1 in order to detect a defect of signal lines connected to the user logic unit UL1 and the user logic circuit L1. During the logic test mode, the register REG7 stores an input test pattern to be supplied to the user logic unit UL2, whereas, during the macro test mode, the register REG7 stores a read data signal supplied from the memory macro MM. The information stored in the registers REG4-REG7 is transferred to the test control unit TCNT through the scan path SP2 and is compared with an expected value. In addition, the input test pattern set in the register REG7 is transferred from the test control unit TCNT through the scan path SP2.

The length of a signal line between the user logic circuit L1 and the memory macro MM is designed to be equal to the length of a signal line between the user logic circuit L1 and the register REG4. The length of a signal line between the user logic circuit L2 and the memory macro MM is designed to be equal to the length of a signal line between the user logic circuit L2 and the register REG5. Similarly, the length of a signal line between the user logic circuit L3 and the memory macro MM is designed to be equal to the length of a signal line between the user logic circuit L3 and the register REG6. With this configuration, the registers REG4-REG6 can receive signals output from the user logic circuits L1-L3 at the same timing as the timing of the memory macro MM receiving these signals, respectively.

During the macro test mode, the check circuit CHK compares the read data OD, read out from the memory macro MM and stored in the register REG7, with an expected value to detect a defect of the memory macro MM. The comparison result is sent to outside of the system SYS through a dedicated terminal or is sent to outside of the system SYS through the test control unit TCNT.

The user logic unit UL2 has the user logic circuit L4 (output user logic circuit) and the scan register (output register) REG8 connected to the scan path SP1. The user logic circuit L4 operates in response to the output data signal OD output from an external data output terminal OD of the memory macro MM to generate a user output signal OD0. The user logic circuit L4 may receive signals other than the output data signal OD. The register RED8 stores the user output signal OD0 supplied from the user logic unit UL2 in order to detect a defect of signal lines connected to the user logic unit UL2 and the user logic circuit L2 during the logic test mode. The information stored in the register REG8 is transferred to the test control unit TCNT through the scan path SP1 and is compared with an expected value.

Hereinafter, the propagation delay time of each of the user logic circuits L1-L3, the access time of the memory macro MM, and the propagation delay time of the user logic circuit L4 are referred to as IPATH, MPATH, and OPATH, respectively. Although the propagation delay time of the user logic circuits L1-L3 actually differs from one another, a description will be given for a case where the propagation delay time is the same. The IPATH is substantially equal to propagation delay time between output of signals from the registers REG1-REG3 and input of the signals to the memory macro MM. The OPATH is substantially equal to the propagation delay time between output of a signal from the memory macro MM to input of the signal to the register REG8.

Figure 4:
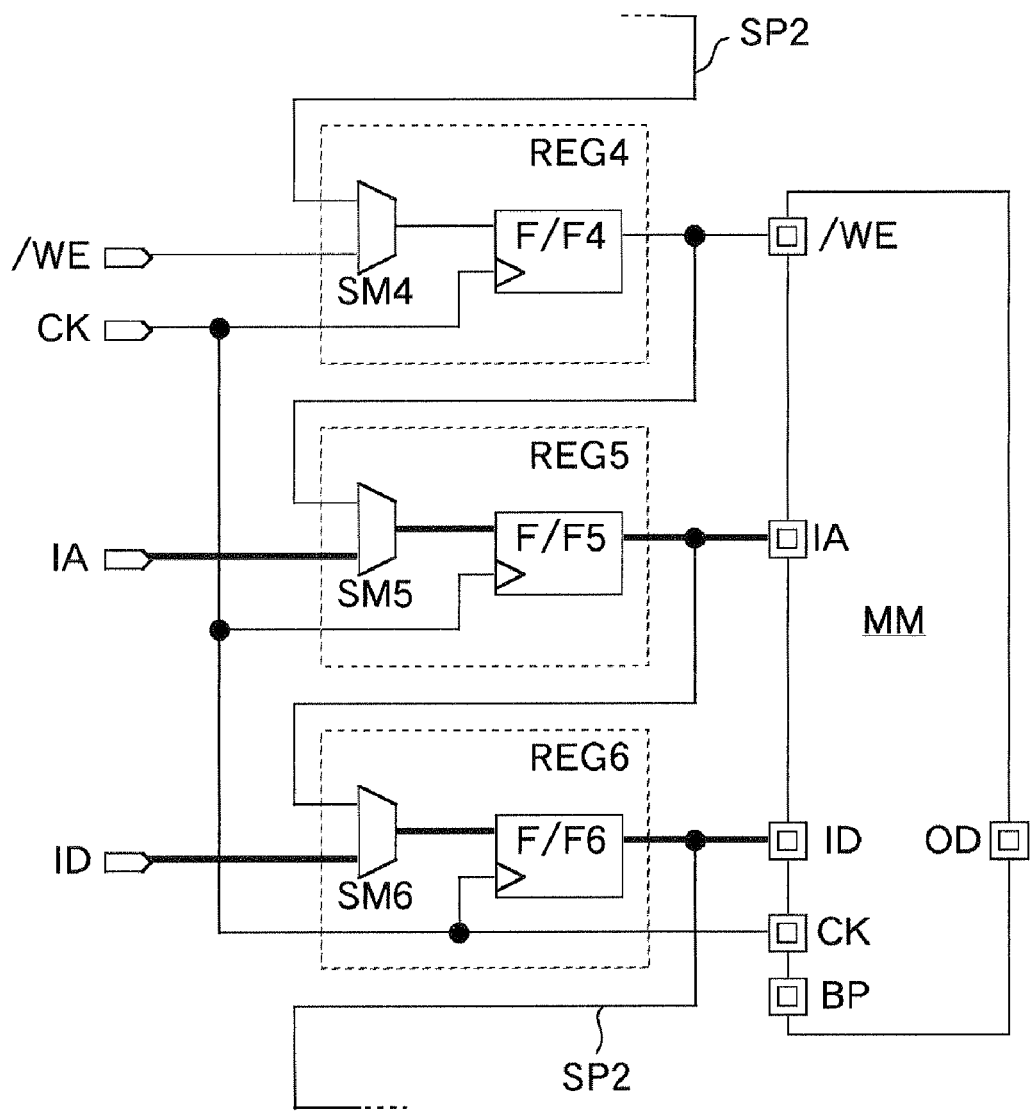
FIG. 4 shows a detailed view of registers REG4-REG6 shown in FIG. 3.

FIG. 4 shows a detailed view of the registers REG4-REG6 shown in FIG. 3. Each register REG (REG4-REG6) has a scan multiplexer SM (SM4-SM6) and a flip-flop F/F (F/F4-F/F6). The scan multiplexer SM selects the scan path SP2 when transferring information stored in the flip-flops F/F4-F/F6 to the test control unit TCNT through the scan path SP2. In other cases, the scan multiplexer SM selects outputs of the selectors S1-S3 shown in FIG. 3. The flip-flop F/F latches, in synchronization with a rising edge of the clock signal CK, a logic level of a signal output from the scan multiplexer SM and outputs the latched signal.

FIG. 5 shows an operation of the memory macro MM shown in FIG. 1 performed in the normal operation mode. In the normal operation mode, the memory macro MM is accessed to realize functions of the system SYS. During the normal operation mode, the bypass mode signal BP is fixed to a low level L.

In this example, a write command WR1 and read commands RD1 and RD2 are sequentially supplied to the memory macro MM. The command decoder 12 recognizes the write command WR1 when the level of the write enable signal /WE is low at a rising edge of the clock signal CK. The command decoder 12 also recognizes the read command RD1 or RD2 when the level the write enable signal /WE is high at a rising edge of the clock signal CK. The command decoder 12 outputs the active signal ACTP (pulse signal) every time the command decoder 12 receives the write command or the read command ((a), (b), (c) in FIG. 5).

An address signal A1 and write data D1 are supplied to the memory macro MM along with the write command WR1 ((d) in FIG. 5). The data input buffer 16 outputs the write data D1 to the write amplifier WA as the internal input data signal DIN ((e) in FIG. 5). The timing generator 14 outputs, in synchronization with the active signal ACTP, the input data latch signal IDLAT (pulse signal) ((f) in FIG. 5). The write amplifier WA receives, in synchronization with the input data latch signal IDLAT, the data signal DIN and writes the data signal in the memory cells MC.

The address signal A1 is supplied to the memory macro MM along with the read command RD1 ((g) in FIG. 5). At this time, the data input buffer 16 outputs a given data signal DX ((h) in FIG. 5). The address signal A1 indicates the same value as that supplied along with the write command WR1. The timing generator 14 outputs, in synchronization with the active signal ACTP, the output data latch signal ODLAT (pulse signal) ((i) in FIG. 5). The read amplifier RA latches, in synchronization with the output data latch signal ODLAT, a logic level of the data signal D1 supplied from the memory cell MC and outputs the data signal D1 as the output data signal DOUT ((j) in FIG. 5).

The flip-flop F/F shown in FIG. 1 latches, in synchronization with the output data latch signal ODLAT, a logic level of the given data signal DX and outputs the logic level as the test output data signal TDOUT ((k) in FIG. 5). Since the level of the bypass mode signal BP is low, the data selector DSEL outputs the read data D1 supplied from the memory core CORE to the data output terminal OD ((l) in FIG. 5). The access time between reception of the read command RD1 and output of the read data D1 is equal to TA. An address signal A2 is then supplied to the memory macro MM along with the read command RD2 and a next read operation is executed.

FIG. 6 shows an operation of the memory macro MM performed in the logic test mode for testing the user logic circuit L4. As in the case shown in FIG. 5, in this example, the write command WR1 and the read commands RD1 and RD2 are sequentially supplied to the memory macro MM. However, the level of the address signal IA may be high H or low L ((a) in FIG. 6). As described above, during the logic test mode, the commands WR1, RD1, and RD2 are supplied through the user logic circuits L1-L3 on the basis of values set in the registers REG1-REG3, respectively.

The data signal ID is supplied asynchronously with the write command WR1. Accordingly, a given write data signal ID is written in the memory macro MM in synchronization with the write command WR1 ((b) in FIG. 6). The write command WR1 does not have to be supplied to the memory macro MM. That is, the read command RD1 may be supplied to the memory macro MM first. Alternatively, the address signal IA and the data signal ID may be supplied to the memory macro MM in synchronization with the write command WR1 and the data may be written in a predetermined memory cell MC.

A data signal ID is then supplied, in synchronization with the read command RD1, to the memory macro MM ((c) in FIG. 6). The memory cell array ARY executes a read operation in response to the read command RD1. The read amplifier RA outputs, in synchronization with the output data latch signal ODLAT, the output data signal DOUT ((d) in FIG. 6). However, since the address signal IA is supplied asynchronously with the read command RD1, the output data signal DOUT has a given value DX. The flip-flop F/F shown in FIG. 1 latches, in synchronization with the output data latch signal ODLAT, a logic level of the data signal D1 supplied from the data input buffer 16 and outputs the test output data signal TDOUT ((e) in FIG. 6). The output timing of the test output data signal TDOUT is the same as that of the output data signal DOUT supplied from the read amplifier RA described with reference to FIG. 5.

Since the level of the bypass mode signal BP is high, the data selector DSEL outputs the test output data signal TDOUT (D1) to the data output terminal OD ((f) in FIG. 6). That is, the data selector DSEL masks the output data signal DOUT supplied from the read amplifier RA.

Since the length of an output data signal line DOUT is the same as that of a test output data signal line TDOUT, the access time between reception of the read command RD1 and output of the read data D1 is equal to TA, which is the same as a case shown in FIG. 5. More specifically, when the level of the bypass mode signal BP is high in the logic test mode, the read data signal D1 is output from the memory macro MM at the same delay time as that employed in the normal operation mode. Accordingly, the test pattern can be supplied to the user logic unit UL2 at the same timing as that employed in the normal operation mode without using a complicated test pattern.

Figure 7:
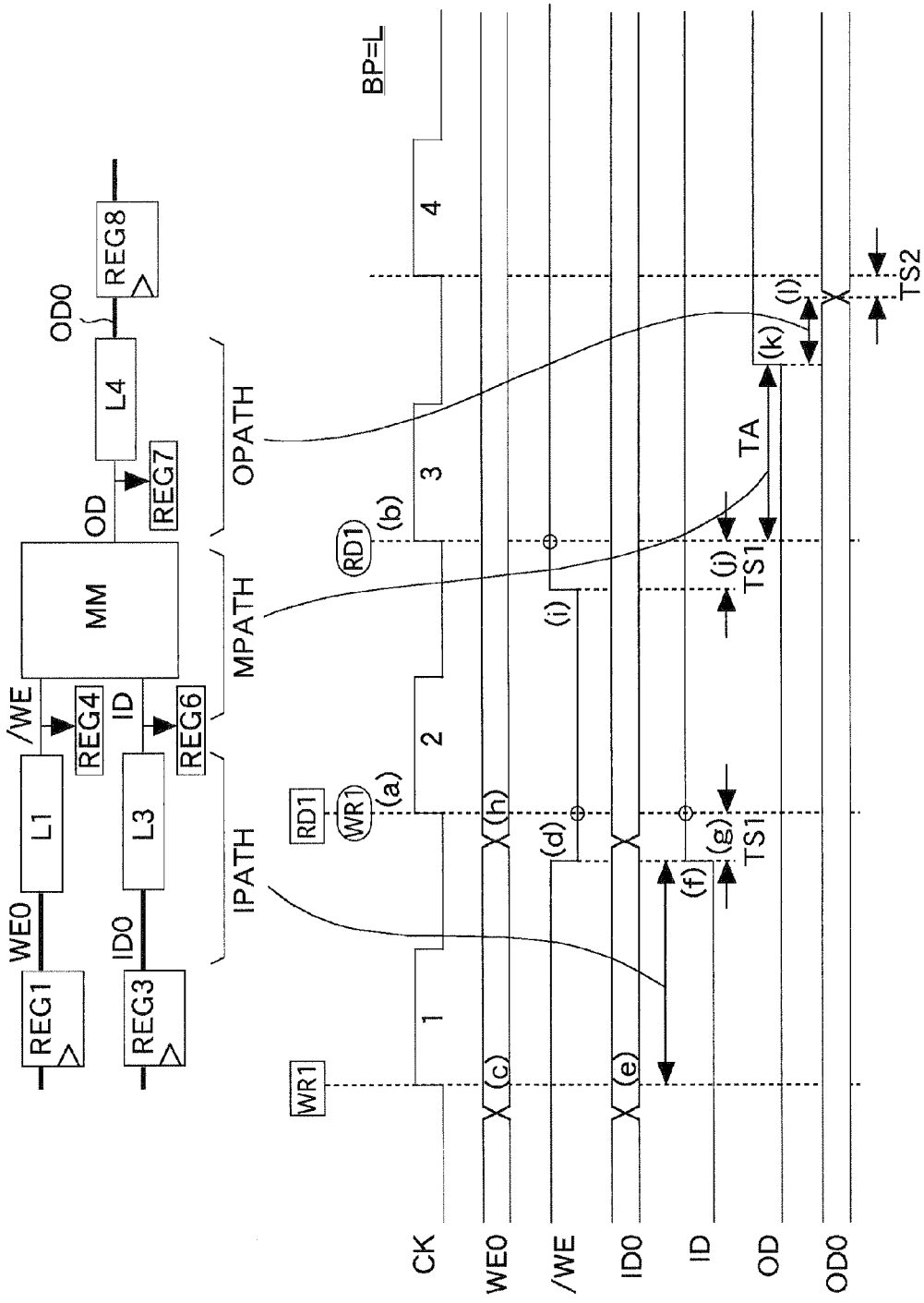
FIG. 7 shows an operation of the system shown in FIG. 3 performed in a normal operation mode.

FIG. 7 shows an operation of the system SYS shown in FIG. 3 performed in the normal operation mode. A write command WR1 and a read command RD1, which are enclosed by rectangles in the drawing, indicate timing of the user logic circuit L1 receiving a control signal WE0, from which the write command WR1 and the read command RD1 are generated, respectively. In this example, the write command WR1 and the read command RD1 are sequentially supplied to the memory macro MM ((a) and (b) in FIG. 7). An operation of the memory macro MM performed in response to the write command WR1 and the read command RD1 is the same as that shown in FIG. 5.

First, the user logic circuit L1 receives, in synchronization with a first rising edge of the clock signal CK, the control signal WE0 ((c) in FIG. 7). After the delay time IPATH corresponding to the logic of the user logic circuit L1, the level of the write enable signal /WE changes to low ((d) in FIG. 7). Similarly, the user logic circuit L3 receives, in synchronization with the first rising edge of the clock signal CK, the control signal ID0 ((e) in FIG. 7). After the delay time IPATH corresponding to the logic of the user logic circuit L3, the level of the input data signal ID changes to high ((f) in FIG. 7).

The delay time IPATH is designed to be shorter than one cycle of the clock signal CK. Accordingly, the write enable signal /WE and the input data signal ID are supplied to the memory macro MM so that sufficient setup time TS1 is provided relative to a second rising edge of the clock signal CK ((g) in FIG. 7). A write operation of the memory macro MM is then executed.

The user logic circuit L1 receives, in synchronization with the second rising edge of the clock signal CK, the control signal WE0 ((h) in FIG. 7). The level of the write enable signal /WE changes to high in accordance with the logic of the user logic circuit L1 ((i) in FIG. 7). The high-level write enable signal /WE is supplied to the memory macro MM so that the sufficient setup time TS1 is provided relative to a third rising edge of the clock signal CK ((j) in FIG. 7). A write operation of the memory macro MM is then executed.

After the access time TA, the memory macro MM outputs the output data signal OD ((k) in FIG. 7). A user logic circuit L4 receives the output data signal OD and outputs the control signal OD0 after the delay time OPATH corresponding to the logic of the user logic circuit L4 ((l) in FIG. 7). The sum of the access time TA and the delay time IPATH is designed to be shorter than one cycle of the clock signal CK. Accordingly, the control signal OD0 is output to a following user logic circuit from the user logic circuit L4 so that sufficient setup time TS2 is provided relative to a fourth rising edge of the clock signal CK. A user logic circuit, not shown, connected to the output terminal of the user logic circuit L4 receives the control signal OD0 in synchronization of the fourth rising edge of the clock signal CK.

Figure 8:
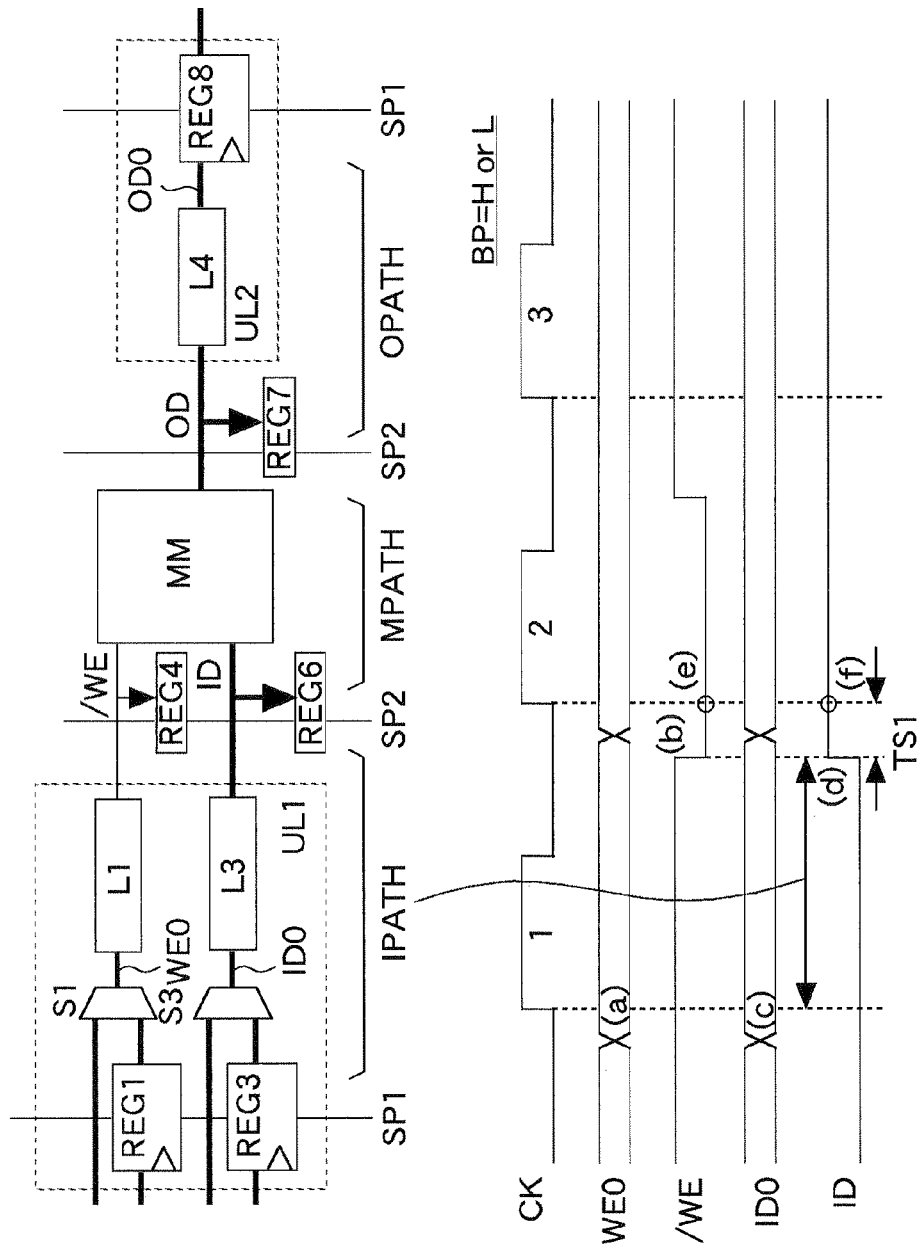
FIG. 8 shows an overview of an operation for testing the user logic unit UL1 shown in FIG. 3.

FIG. 8 shows an overview of an operation performed when the user logic unit UL1 shown in FIG. 3 is tested. The test is carried out in the logic test mode. In the logic test mode, the registers REG1 and REG3 are set using the scan path SP1. The selectors S and S3 select outputs of the registers REG1 and REG3. Since the memory macro MM is not accessed in the test of the user logic unit UL1, the level of the bypass mode signal BP may be set high H or low L.

After the start of the test, the user logic circuit L1 receives, in synchronization with a first rising edge of the clock signal CK, the control signal WE0 supplied from the register REG1 ((a) in FIG. 8). After the delay time IPATH corresponding to the logic of the user logic circuit L1, the level of the write enable signal /WE changes to, for example, low ((b) in FIG. 8). Similarly, the user logic circuit L3 receives, in synchronization with the first rising edge of the clock signal CK, the control signal ID0 ((c) in FIG. 8). After the delay time IPATH corresponding to the logic of the user logic circuit L3, the level of the input data signal ID changes to, for example, high ((d) in FIG. 8).

When the user logic unit UL1 operates correctly, the write enable signal /WE and the input data signal ID are supplied to the registers REG4 and REG6, respectively, so that sufficient set time TS1 is provided relative to a second rising edge of the clock signal CK. The registers REG4 and REG6 latch, in synchronization with the second rising edge of the clock signal CK, the logic levels of the write enable signal /WE and the input data signal ID, respectively ((e) and (f) in FIG. 8). The timing of the registers REG4 and REG6 latching the logic levels are the same as the timing of the command decoder 12 and the data input buffer 16 of the memory macro MM latching the write enable signal /WE and the input data signal ID, respectively. The test control unit TCNT then reads out the information stored in the registers REG4 and REG6 using the scan path SP2 and compares the information with an expected value.

As described above, the length of the signal line between the user logic circuit L1 and the memory macro MM is designed to be equal to the length of the signal line between the user logic circuit L1 and the register REG4. Similarly, the length of the signal line between the user logic circuit L3 and the memory macro MM is designed to be equal to the length of the signal line between the user logic circuit L3 and the register REG6. Accordingly, whether a signal output from the user logic unit UL1 is supplied to the memory macro MM at correct timing can be tested in the test shown in FIG. 8. That is, operation timing of the user logic unit UL1 can be evaluated or a stuck-at fault of the user logic unit UL1 can be detected.

A test of the user logic circuit L2 for outputting the input address signal IA can be executed in a manner similar to that of the tests of the user logic circuits L1 and L3. At the time of the test of the user logic circuit L1, the level of the write enable signal /WE may be changed to high. At the time of the test of the user logic circuit L2, the level of the input data signal ID may be changed to low.

Figure 9:
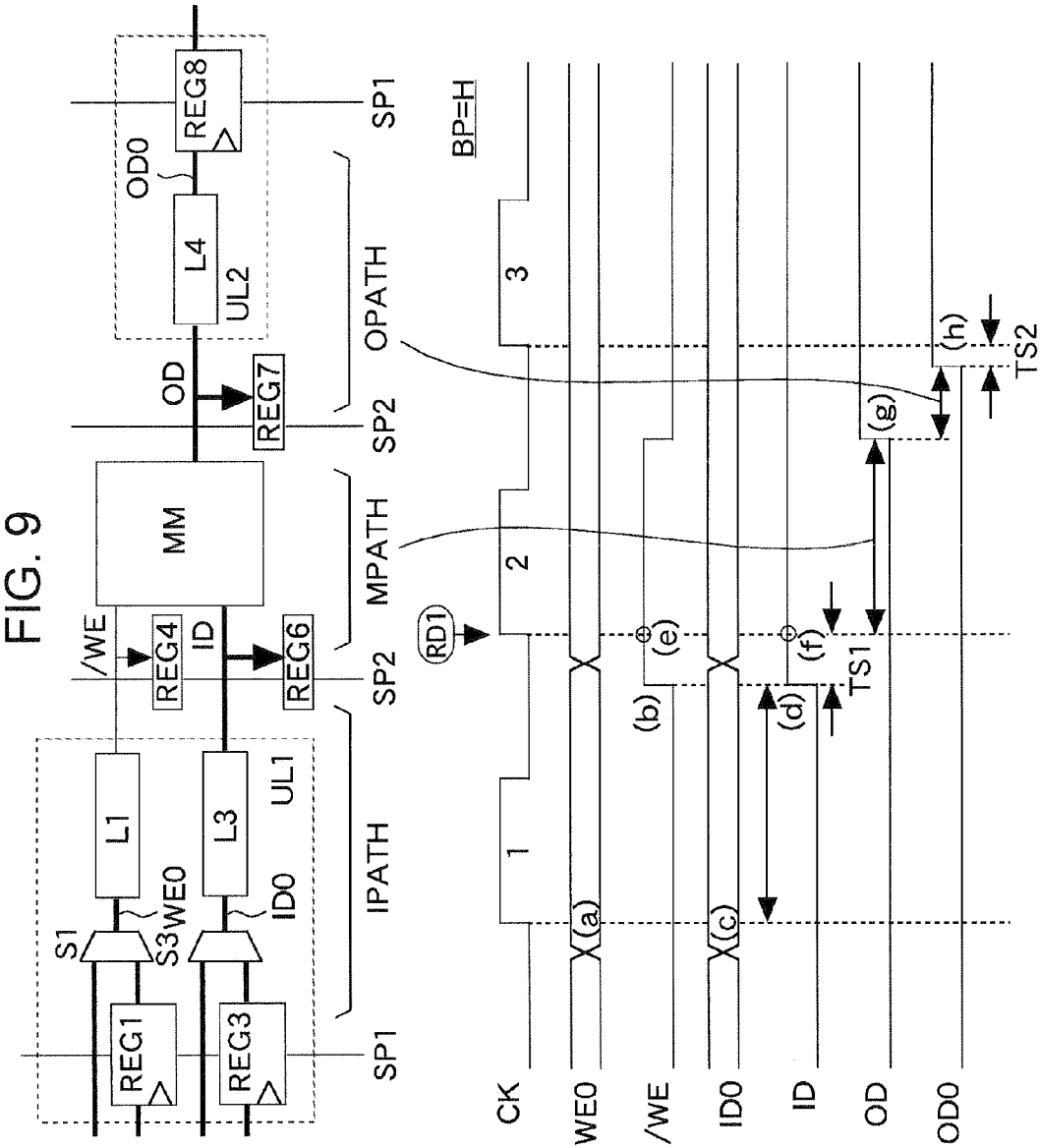
FIG. 9 shows an overview of an operation for testing the user logic unit UL2 shown in FIG. 3.

FIG. 9 shows an overview of an operation performed when the user logic unit UL2 shown in FIG. 3 is tested. The test is carried out in the logic test mode. In the logic test mode, a test signal is supplied to the memory macro MM using the user logic unit UL1 and the output data signal OD fed from the memory macro MM is supplied to the user logic unit UL2. The bypass mode signal BP is set to the high level H.

First, the registers REG1 and REG3 are set using the scan path SP1. The selectors S1 and S3 select outputs of the registers REG1 and REG3, respectively. The user logic circuit L1 receives, in synchronization with a first rising edge of the clock signal CK, the control signal WE0 supplied from the register REG1 ((a) in FIG. 9). After the delay time IPATH, the level of the write enable signal /WE changes to, for example, high ((b) in FIG. 9). Similarly, the user logic circuit L3 receives, in synchronization with the first rising edge of the clock signal CK, the control signal ID0 ((c) in FIG. 9) and changes the level of the input data signal ID to, for example, high after the delay time IPATH ((d) in FIG. 9).

The memory macro MM receives, in synchronization with a second rising edge of the clock signal CK, the high-level write enable signal /WE and the high-level input data signal ID ((e) and (f) in FIG. 9). More specifically, the read command RD1 is supplied to the memory macro MM together with the input data signal ID. Since the level of the bypass mode signal BP is high, the input data signal ID received with the read command RD1 is output as the output data signal OD after the read access time TA as shown in FIG. 6 ((g) in FIG. 9).

The output data signal OD is supplied to the user logic circuit L4 (output user logic circuit). The control signal OD0 is output from the user logic circuit L4 after the delay time OPATH corresponding to the logic of the user logic circuit L4 ((h) in FIG. 9). When the user logic circuit L4 operates correctly, the control signal OD0 is supplied to the register REG8 so that the sufficient setup time TS2 is provided relative to a third rising edge of the clock signal CK.

The register REG8 latches, in synchronization with the third rising edge of the clock signal CK, the logic level of the control signal OD0. The information stored in the register REG8 is then read out by the test control unit TCNT using the scan path SP1 and is compared with an expected value. When the information read out from the register REG8 differs from the expected value, a defect of the user logic circuit L4 (a stuck-at fault or a timing margin fault) is detected.

As described above, in this embodiment, a transition delay test of the user logic circuit L4 including a test of operation timing of the memory macro MM can be executed using simple test patterns and simple test circuits (the flip-flop F/F and the data selector DSEL shown in FIG. 1). Furthermore, since the test patterns are simple, the test patterns can be generated using an automatic test pattern generation (ATPG) method generally employed in a logic circuit fault detection test. As a result, the test cost can be reduced.

Figure 10:
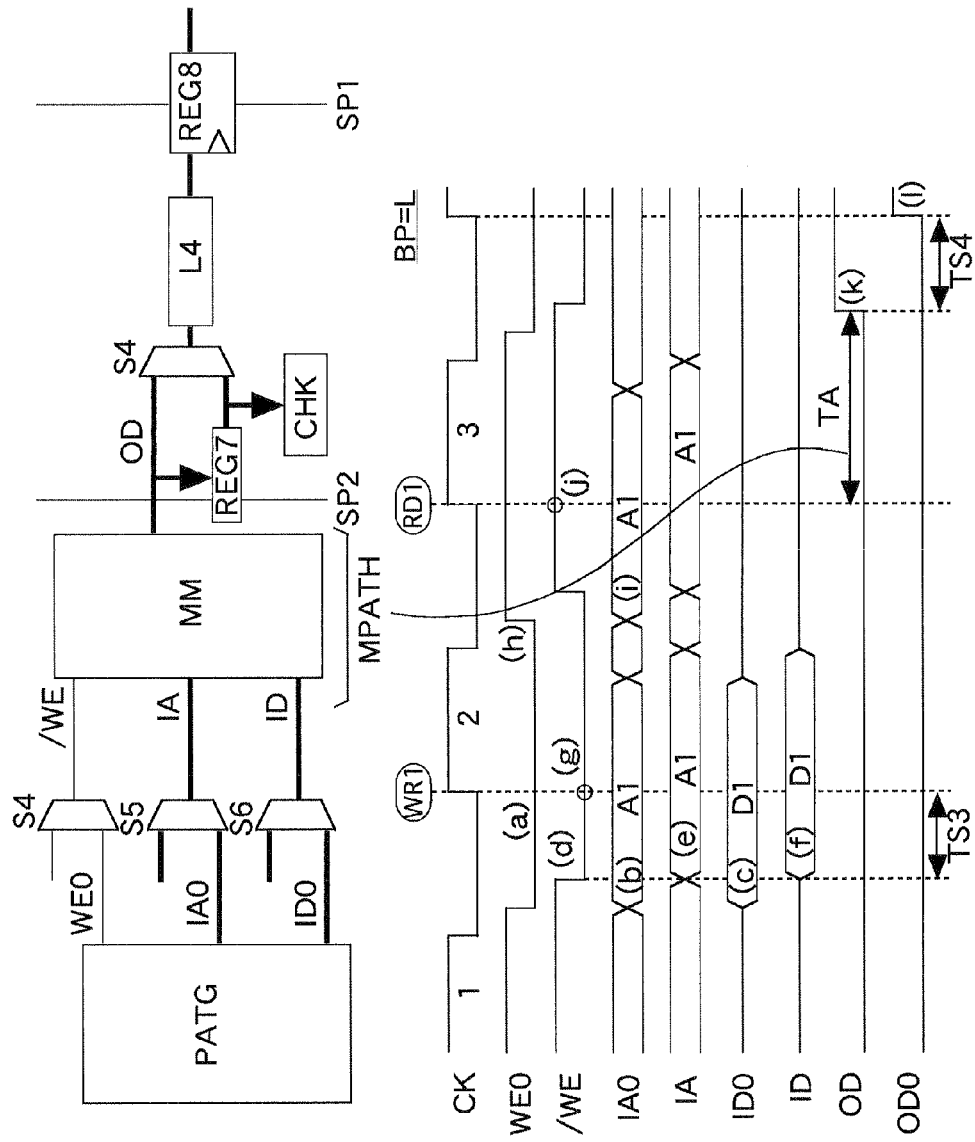
FIG. 10 shows an overview of an operation test of the memory macro shown in FIG. 1.

FIG. 10 shows an overview of an operation test of the memory macro MM shown in FIG. 1. The operation test of the memory macro MM is executed using the pattern generating circuit PATG and the check circuit CHK in a macro test mode.

For example, the pattern generating circuit PATG outputs, in synchronization with a first rising edge of the clock signal CK, the low-level write enable signal WE0 (write command WR1), the write address signal IA0 (A1), and the write data signal ID0 (D1) ((a), (b), and (c) in FIG. 10). The signals WE0, IA0, and ID0 are supplied to the memory macro MM as the write enable signal /WE, the address signal IA (A1), and the input data signal ID (D1) through the selectors S4, S5, and S6, respectively ((d), (e), and (f) in FIG. 10).

Since no delay element, such as a logic circuit, is present between the pattern generating circuit PATG and the memory macro MM, the write enable signal /WE is supplied so that sufficient setup time TS3 is provided relative to a second rising edge of the clock signal CK. The memory macro MM receives, in synchronization with the second rising edge of the clock signal CK, the low-level write enable signal /WE and executes a write operation ((g) in FIG. 10).

The pattern generating circuit PATG then outputs, in synchronization with the second rising edge of the clock signal CK, the high-level write enable signal WE0 (read command RD1) and the read address signal IA0, for example ((h) and (i) in FIG. 10). The memory macro MM receives, in synchronization with a third rising edge of the clock signal CK, the high-level write enable signal /WE and executes a read operation ((j) in FIG. 10). After the access time TA, the memory macro MM outputs the output data signal OD (read data) ((k) in FIG. 10).

The register REG7 latches, in synchronization with the fourth rising edge of the clock signal CK, the output data signal OD ((l) in FIG. 10). Since no delay element, such as a logic circuit, is present between the memory macro MM and the register REG7, the output data signal OD is supplied so that sufficient setup time TS4 is provided relative to the fourth rising edge of the clock signal CK. The signal latched by the register REG7 is supplied to the check circuit CHK. That is, the scan paths SP1 and SP2 are not used. The check circuit CHK compares a logic level of the output data signal OD with an expected value to detect whether the memory macro MM has a defect. In this manner, since the operation test of the memory macro MM is executed using dedicated test circuits (the pattern generating circuit PATG and the check circuit CHK) without using the user logic circuits L1-L4, time taken for the test can be shortened.

Figure 11:
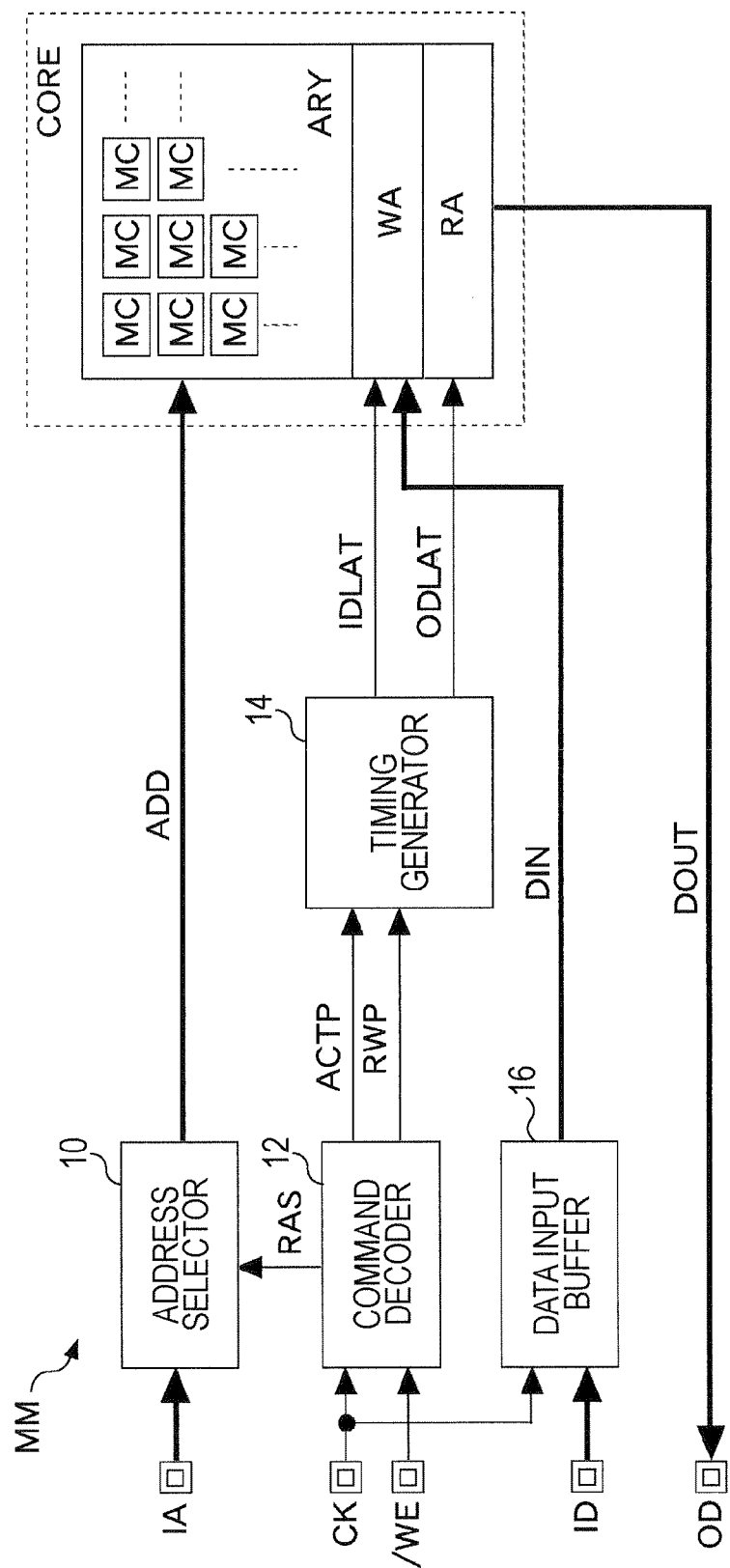
FIG. 11 shows a memory macro employed before the proposal of the memory macro shown in FIG. 1.

FIG. 11 shows a memory macro MM employed before the memory macro MM shown in FIG. 1 is proposed. The memory macro MM shown in FIG. 11 is not widely known. Referring to FIG. 11, the flip-flop F/F, the data selector DSEL, and the bypass mode terminal BP are omitted from the memory macro shown in FIG. 1. The remaining configuration is the same as that shown in FIG. 1. A system SYS has the same configuration as that shown in FIGS. 2 and 3.

Figure 12:
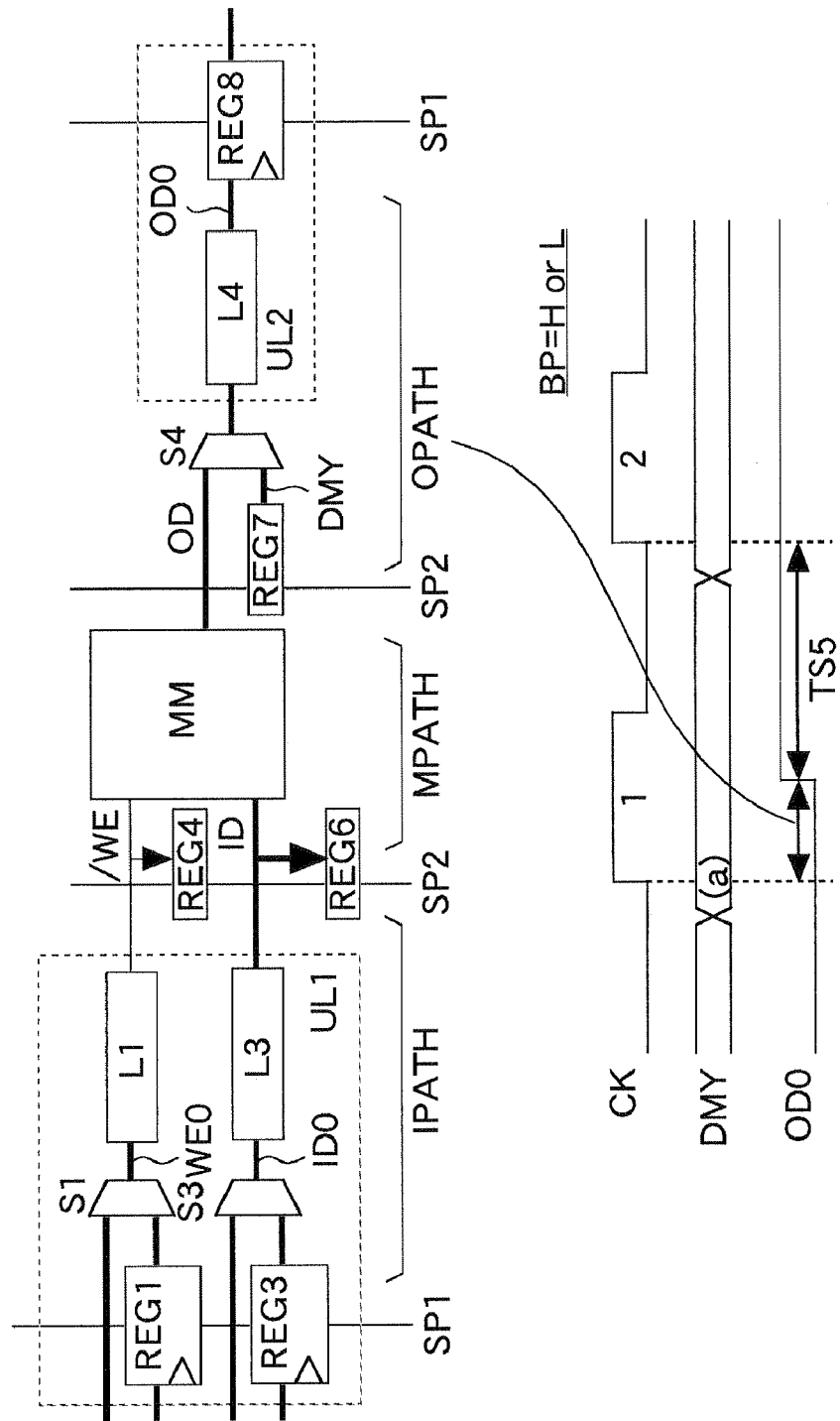
FIG. 12 shows an overview of an operation for testing a user logic unit UL2 in a system including the memory macro shown in FIG. 11.

FIG. 12 shows an overview of an operation performed when the user logic unit UL2 is tested in a system having the memory macro MM shown in FIG. 11. The test is executed in the logic test mode. In the logic test mode, a register REG7 is set using the scan path SP2. The selector S4 selects an output of the register REG7. Since the memory macro MM is not accessed in this test, the level of the bypass mode signal BP may be high H or low L.

A user logic circuit L4 receives, in synchronization with a first rising edge of a clock signal CK, a control signal DMY from the register REG7 ((a) in FIG. 12). The level of the control signal OD0 changes to, for example, high after the delay time OPATH corresponding to the logic of the user logic circuit L4 ((b) in FIG. 12). In the example shown in FIG. 11, the access time TA of the memory macro MM is not included in a first clock cycle of the clock signal CK. Accordingly, a register REG8 latches the control signal OD0 so that sufficient setup time TS5 is provided relative to a second rising edge of the clock signal CK. The setup time TS5 is much longer than the setup time TS2 shown in FIG. 9. As a result, a stuck-at fault of the user logic circuit L4 can be detected but operation timing of the user logic circuit L4 may not be evaluated.

As described above, in this embodiment, the input data signal ID received with the data input terminal ID of the memory macro MM can be output, in synchronization with actual operation timing of the memory cell array ARY, to the data output terminal OD as the output data signal OD during the test mode. The memory macro MM can be operated in a simulated manner using a small number of input signals and simple test circuits (the flip-flop F/F and the data selector DSEL) and the output data signal OD can be generated without writing the data in the memory cell MC.

Accordingly, the test of the user logic circuit L4 that operates in response to the output data signal OD can be executed using simple test patterns. That is, a timing test of the user logic circuit L4 including a test if operation timing of the memory macro MM can be executed using simple test patterns. As a result, the test cost can be reduced. The operation timing of the memory cell array ARY that operates asynchronously with the clock signal CK can be realized using simple test circuits (the flip-flop F/F and the data selector DSEL).

The input data signal ID to be supplied to the memory macro MM is stored in the register REG3 through the scan path SP1. The user output signal OD0 that is output from the user logic circuit L4 and is stored in the register REG8 is transferred to the test control unit TCNT through the scan path SP1. With this configuration, the timing test of the user logic circuit L4, including the test of the operation timing of the memory macro MM, can be readily executed, thus leading to a decrease in the test cost. In particular, when the user logic circuit L3 is inserted between the register REG3 and the memory macro MM, the operation test of the user logic circuit L4, including the test of the operation timing of the memory macro MM, can be executed using simple test patterns.

Figure 13:
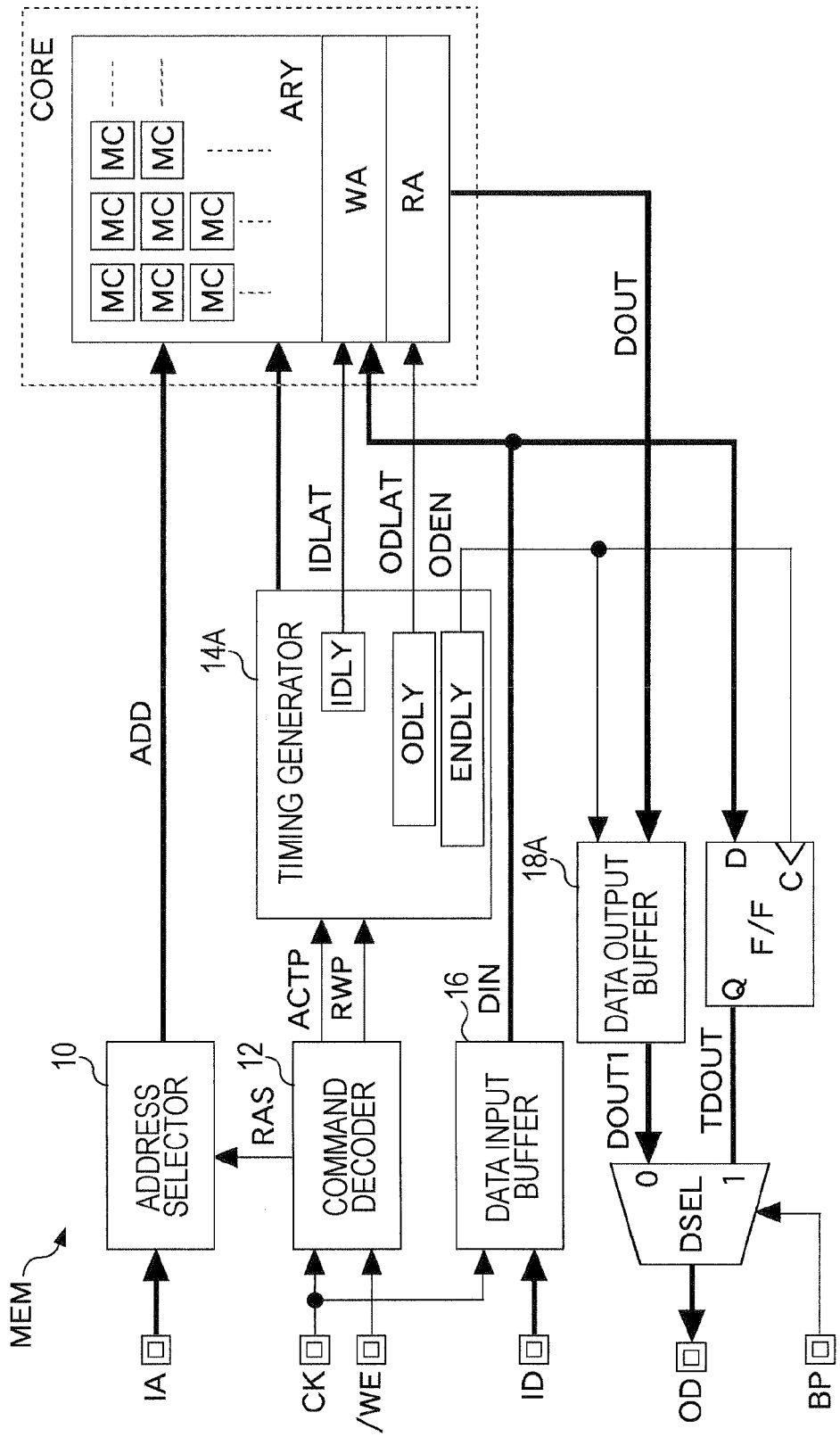
FIG. 13 shows an example of a memory macro according to aspects of another embodiment.

FIG. 13 shows an example of a memory macro MM according to another embodiment. The similar or like references designate elements commonly described in the above embodiment and a detailed description thereof is omitted. The configuration other than the configuration of the memory macro MM is the same as that employed in the above-described embodiment. More specifically, the memory macro MM is mounted on the system SYS shown in FIGS. 2 and 3.

The memory macro MM has a timing generator 14A instead of the timing generator 14 shown in FIG. 1. In addition, a data output buffer (data output unit) 18A is provided between a read amplifier RA and a data selector DSEL. The other configuration of the memory macro MM is the same as that shown in FIG. 1.

A load of a test output data signal line TDOUT is designed to be equal to a load of an output data signal line DOUT1 connected to an output terminal of the data output buffer 18A. For example, the signal lines TDOUT and DOUT1 have the same structure and the lengths thereof are equal to each other. With such a configuration, output timing of a test output data signal TDOUT from a flip-flop F/F and output timing of an output data signal DOUT1 from the data output buffer 18A can be set equal. Accordingly, as in the case of the above-described embodiment, the access time TA of the memory macro MM in a normal operation mode can be set equal to the access time TA of the memory macro MM in a logic test mode. Accordingly, the memory macro MM can be operated in a simulated manner using simple test patterns.

Generally, the length of the signal line (DOUT1) extending from the data output buffer 18A to the data output terminal OD is shorter than the length of the output data signal line DOUT extending from the read amplifier RA to the data output buffer 18A. In addition, when the data output terminal OD has a plurality of signal lines corresponding to a plurality of bits, a variance in the lengths of the signal lines (DOUT1) is smaller than a variance in the lengths of the output data signal lines DOUT because the lengths of the memory cell array ARY and the read amplifier RA in the horizontal direction of the drawing are longer. Accordingly, in this embodiment, the length of the test output data signal line TDOUT can be set shorter than that shown in FIG. 1. As a result, an area where the test output data signal lines TDOUT are disposed can be reduced and the size of the memory macro MM can be decreased. In addition, since the variance in the loads of the test output data signal lines TDOUT relative to the respective output data signal lines DOUT can be minimized, the read access time TA can be very accurately set equal to the read access time TA of the normal operation mode in the logic test mode, in which the level of the bypass mode signal BP is set to high when the test output data signal lines TDOUT corresponding to a plurality of bits are provided.

In addition to functions of the timing generator 14 shown in FIG. 1, the timing generator 14A additionally has a function for outputting an output data enable signal ODEN. When the level of a write enable signal /WE is high, a delay circuit ENDLY changes the level of the output data enable signal ODEN to high after a predetermined time has passed since a rising edge of an active signal ACTP. The delay time of the delay circuit ENDLY is slightly longer than that of a delay circuit ODLY. The delay circuit ENDLY keeps the output data enable signal ODEN at the high level for a predetermined period (approximately one clock cycle).

While the level of the output data enable signal ODEN is high, the data output buffer 18A outputs an output data signal DOUT supplied from the read amplifier RA as an output data signal DOUT1. In this embodiment, the flip-flop F/F latches, in synchronization with the output data enable signal ODEN instead of the output data latch signal ODLAT, a logic level of the input data signal DIN and outputs the logic level as a test output data signal TDOUT.

Figure 14:
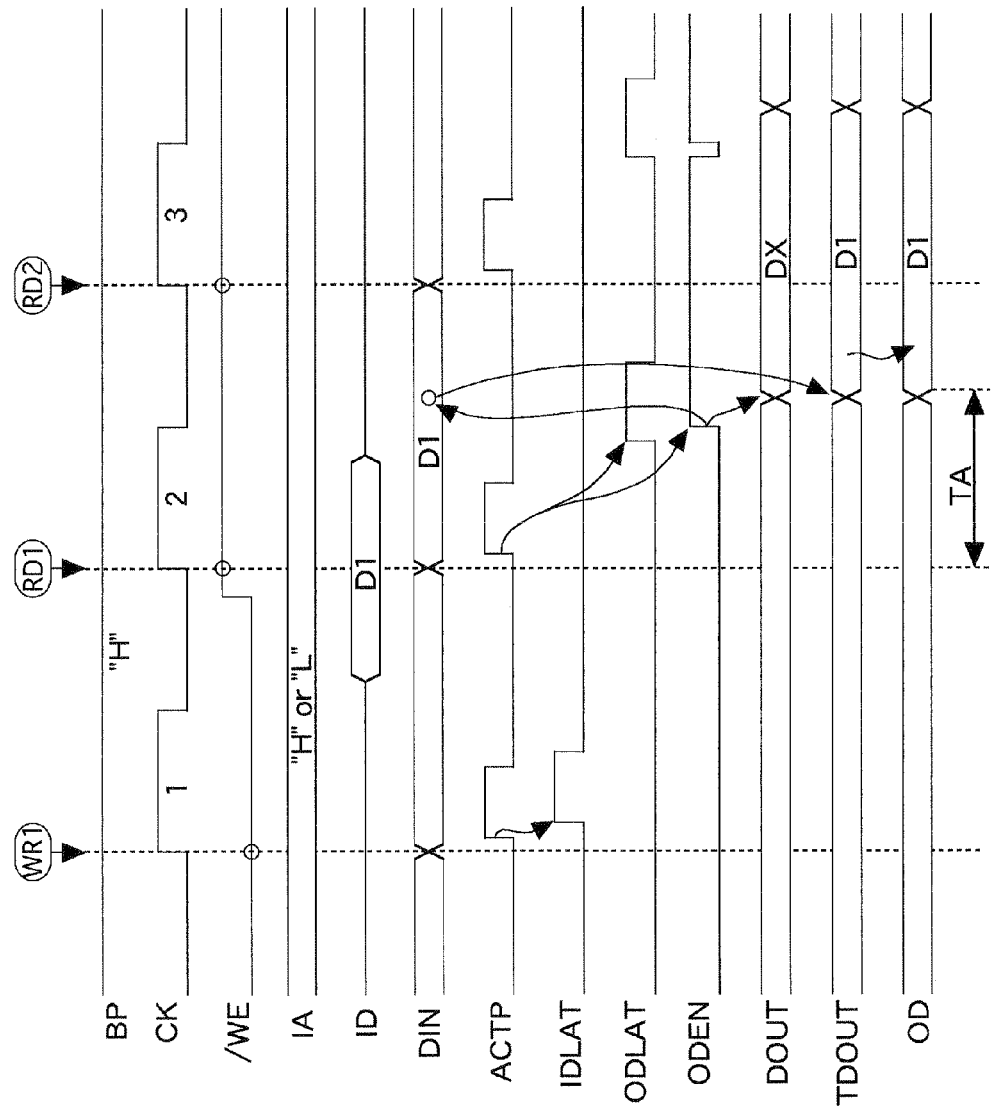
FIG. 14 shows an operation of a memory macro MM performed to test a user logic circuit L4 in the memory macro shown in FIG. 13 in a logic test mode.

FIG. 14 shows an operation of the memory macro MM shown in FIG. 13 performed in a logic test mode for testing a user logic circuit L4. In this embodiment, the test output data signal TDOUT and the output data signal OD are output in synchronization with a rising edge of the output data enable signal ODEN. The other operations are the same as those shown in FIG. 6. Since the lengths of the output data signal line DOUT1 and the test output data signal line TDOUT shown in FIG. 13 are the same, the read access time between reception of a read command RD and output of read data D1 is equal to TA shown in FIGS. 5 and 6.

As described above, advantages similar to those provided by the above-described embodiment can be obtained in this embodiment. Furthermore, since the area where the test output data signal line TDOUT is disposed can be reduced in this embodiment, the size of the memory macro MM can be decreased. When the test output data signal lines TDOUT corresponding to a plurality of bits are provided, the read access time TA can be highly accurately set equal to the read access time TA of the normal operation mode in the test mode, in which the level of the bypass mode signal BP is set to high. As a result, the test of the user logic circuit L4 can be executed using the same timing margin as that of an actual operation of the memory macro MM.

Figure 15:
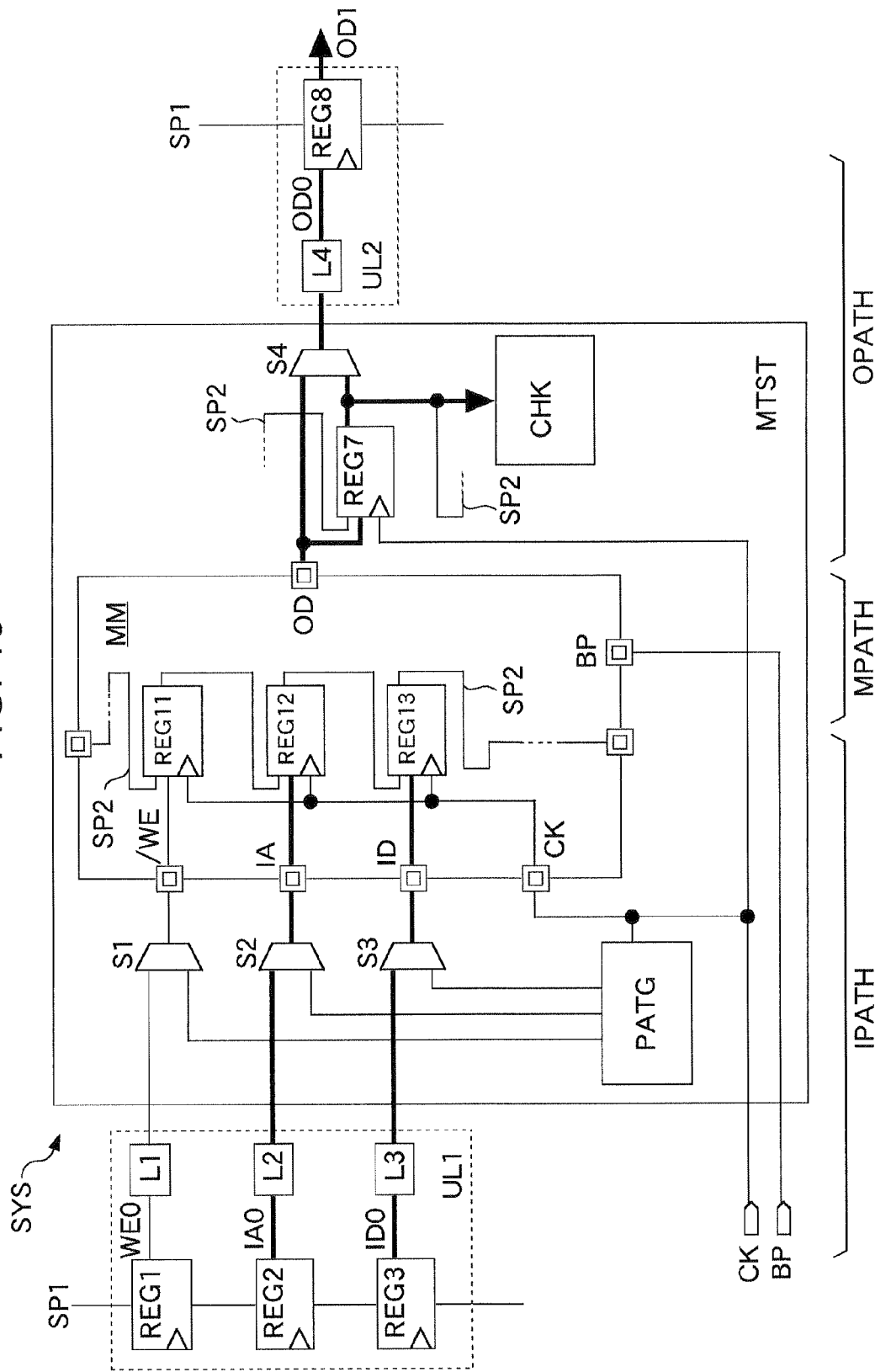
FIG. 15 shows a detailed view of major parts of a system according to aspects of another embodiment.

FIG. 15 shows a detailed view of major parts of a system SYS according to another embodiment. The similar or like references designate elements commonly described in the above embodiment and a detailed description thereof is omitted. In this embodiment, the system SYS has registers REG11-REG13 instead of the registers REG4-REG6 shown in FIG. 3. The registers REG11-REG13 are formed in the memory macro MM. The registers REG11-REG13 have the same configuration as that of the registers REG4-REG6 (FIG. 4). The remaining configuration of the system SYS is the same as that shown in FIGS. 2 and 3 except that an external terminal for a scan path SP2 is formed in the memory macro MM.

Figure 16:
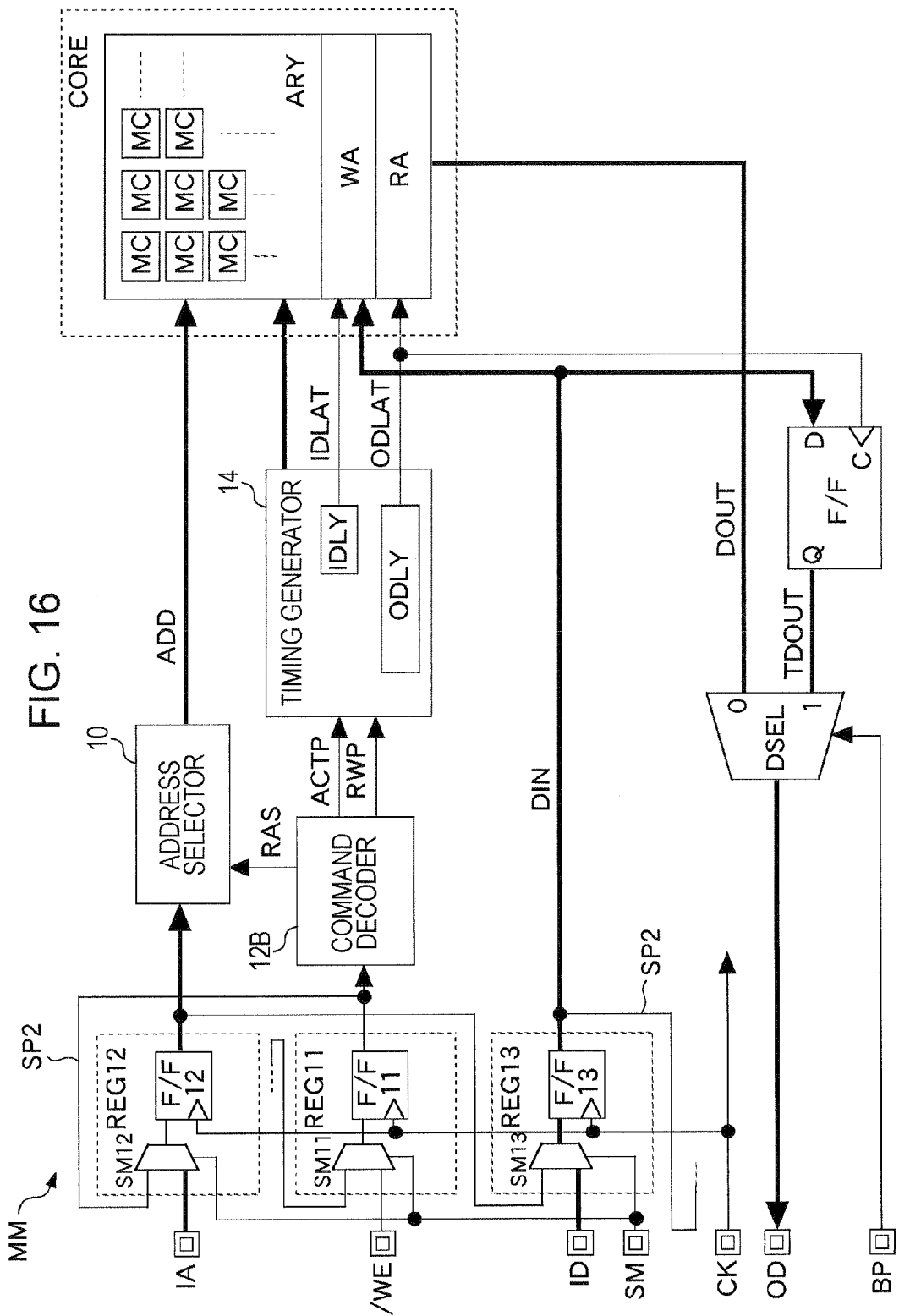
FIG. 16 shows a detailed view of the memory macro shown in FIG. 15.

FIG. 16 shows a detailed view of the memory macro MM shown in FIG. 15. The memory macro MM has a command decoder 12B instead of the command decoder 12 shown in FIG. 1. Since the register REG13 has a function of a data input buffer, the data input buffer 16 shown in FIG. 1 is omitted. The remaining configuration is the same as that shown in FIG. 11 except that the registers REG11-REG13 are formed. The major parts of the memory macro MM may have the configuration shown in FIG. 13 instead of the configuration shown in FIG. 1. More specifically, the memory macro MM may include the data output buffer 18A.

Each register REG (REG11-REG13) has a scan multiplexer SM (SM11-SM13) and a flip-flop F/F (F/F11-F/F13). An operation of the registers REG11-REG13 is the same as that of the registers REG4-REG6 described with reference to FIG. 4. The flip-flop F/F13 of the register REG13 is connected to a scan path SP2 and operates as a holding unit for holding an input data signal ID.

The command decoder 12B has the same function as the command decoder 12 shown in FIG. 1 except for operating asynchronously with a clock signal CK. In this embodiment, the register REG11 latches, in synchronization with the clock signal CK, a write enable signal /WE. Accordingly, the command decoder 12B has to operate asynchronously with the clock signal CK. That is, the register REG11 and the command decoder 12B realize the function of the command decoder 12 shown in FIG. 1.

Figure 17:
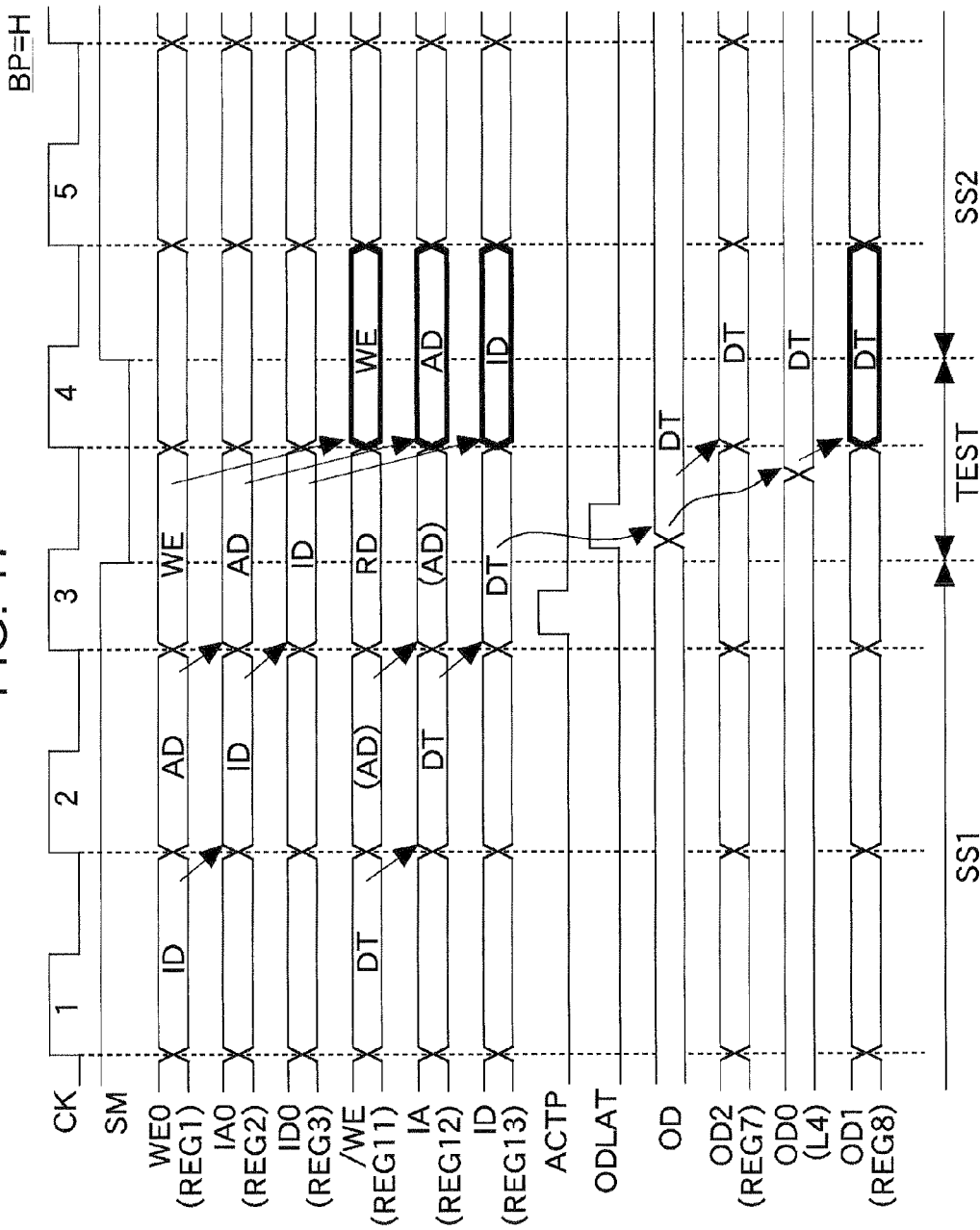
FIG. 17 shows an overview of an operation performed to test the user logic unit UL2 shown in FIG. 15.

FIG. 17 shows an overview of an operation performed when user logic units UL1 and UL2 shown in FIG. 15 are tested. In this embodiment, a test of the user logic unit UL1 can be executed during execution of the test shown in FIG. 9. The level of the bypass mode signal BP is set to high. Accordingly, a logic level of an input data signal DIN is directly output to a data output terminal OD as an output data signal OD using the flip-flop F/F in a read operation. The period when the level of a signal SM is high corresponds to a period (scan shift periods SS1 and SS2) when a scan multiplexer SM selects the scan paths SP1 and SP2. The period when the level of the signal SM is low corresponds to a period (test period TEST) when the scan multiplexer SM selects signal lines connected to the user logic units UL1 and UL2.

During the scan shift period SS1, input patterns (test input signals) for testing a user logic unit UL1 are sequentially set in the registers REG1-REG3 using the scan paths SP1 and SP2. In addition, input patterns (test input signals) for testing the user logic unit UL2 are sequentially set in the registers REG11-REG13 (flip-flops F/F11-F/F13).

The test control unit TCNT then sets the level of the signal SM to low. The test patterns set in the registers REG1-REG3 and REG11-REG13 are supplied to the user logic circuits L1-L3, the memory macro MM, and the user logic circuit L4. In this manner, the user logic circuits L1-L3 operate in accordance with the input patterns set in the registers REG1-REG3, respectively. The memory macro MM operates in accordance with the input patterns set in the registers REG11-REG13. The user logic circuit L4 operates in accordance with the output data signal OD that is output from the data output terminal OD of the memory macro MM.

The registers REG11-REG13 latch, in synchronization with a fourth rising edge of the clock signal CK, output signals supplied from the user logic circuits L1-L3, respectively. The register REG7 latches a signal output from the memory macro MM, whereas the register REG8 latches a signal output from the user logic circuit L4.

The test control unit TCNT then sets the level of the signal SM to high. Information stored in the registers REG11-REG13 and REG8, which are shown with thick frames in the drawing, is transferred to the test control unit TCNT through the scan path SP2 and is compared with an expected value. When the information read out from the registers REG11-REG13 differs from the expected value, a defect (a stuck-at fault or a timing margin fault) of the user logic circuits L1-L3 is detected. When the information read out from the register REG8 differs from the expected value, a defect (a stuck-at fault or a timing margin fault) of the user logic circuit L4 is detected. In this manner, tests of the user logic units UL1 and UL2 can be simultaneously executed during one clock cycle.

The information stored in the register REG7 is transferred to the test control unit TCNT through the scan path SP2 and is compared with an expected value. In this manner, whether the fault caused in the test of the user logic unit UL2 results from the memory macro MM or the user logic circuit L4 can be identified.

As described above, advantages similar to those provided by the above-described embodiments can be obtained in this embodiment. Furthermore, in this embodiment, the tests of the user logic units UL1 and UL2 can be executed at the same time during one clock cycle. In particular, the test patterns (test input signals) for testing the user logic circuit L4 can be set in the registers REG11-REG13 using the scan path SP2 without supplying the test patterns through the user logic circuits L1-L3. Accordingly, the test of the user logic circuit L4 can be executed using simple test patterns. That is, test patterns can be generated using an automatic test pattern generation (ATPG) method generally used in a logic circuit fault detection test. As a result, the test cost can be reduced.

In the above-described embodiments, the description has been given for the example in which test circuits (the flip-flop F/F and the data selector DSEL) are provided in the memory macro MM for outputting data signals stored in the memory cells MC after a predetermined time has passed since reception of a read command and the user logic unit UL2 is tested using the test circuits. However, test circuits (the flip-flop F/F and the data selector DSEL) may be provided in another function macro (a data processing macro, such as a CPU macro and an MPEG macro) for outputting a stored data signal after a predetermined time has passed since reception of a read command and the user logic unit UL2 may be tested using these test circuits.

The features and advantages of the embodiments become apparent from the detailed description given above. It is intended that the attached claims include the features and advantages of the above-described embodiments without departing from the spirit and scope thereof. In addition, various improvements and alternations should easily occur to those skilled in the art and it should be understood that the scope of the embodiments having the inventive step is not limited to the above-described embodiments but can include appropriate improvements and equivalences thereof included in the scope disclosed in the embodiments.

What is claimed is:

1. A semiconductor integrated circuit, comprising:
   a data input unit for receiving an input data signal to be supplied to an external data input terminal;
   a storage unit for storing the input data signal received by the data input unit;
   a timing generating unit for generating a timing signal in response to an output request signal;
   a data output unit for outputting, in synchronization with the timing signal, the input data signal stored in the storage unit as an output data signal;
   a test output control unit for outputting, in synchronization with the timing signal, the input data signal received by the data input unit; and
   a data selector for outputting the output data signal supplied from the data output unit to an external data output terminal in a normal operation mode and outputting the input data signal supplied from the test output control unit to the external data output terminal in a test mode.

2. The circuit according to claim 1, further comprising:
   an output user logic circuit for receiving the output data signal supplied from the external data output terminal and operating to generate a user output signal;
   an output register for receiving and storing the user output signal;
   a first scan path connected to the output register; and
   a test control unit for receiving the user output signal stored in the output register through the first scan path and comparing the received user output signal with an expected value in the test mode.

3. The circuit according to claim 2, further comprising:
   an input register for storing the input data signal to be supplied to the external data input terminal; and
   a second scan path connected to the input register,
   wherein the test control unit sets a test input data signal in the input register through the second scan path and compares the user output signal received from the output register through the first scan path with an expected value.

4. The circuit according to claim 1, wherein the data output unit is a read amplifier that amplifies and stores the input data signal supplied from the storage unit.

5. The circuit according to claim 1, wherein the data output unit is a data output buffer for outputting the input data signal supplied from the storage unit.

6. The circuit according to claim 1, further comprising:
   a normal signal line for transferring the output data signal from the data output unit to the data selector; and
   a test signal line for transferring the input data signal from the test output control unit to the data selector, the load of the test signal line being equal to the load of the normal signal line.

7. The circuit according to claim 1, further comprising:
   an input register for storing a test input signal;
   a third scan path connected to the input register;
   an input user logic circuit for receiving the test input signal supplied from the input register, operating to generate an input data signal, and outputting the generated input data signal to the external data input terminal;
   a holding unit for storing the input data signal, the holding unit being provided in the data input unit;
   a fourth scan path connected to the holding unit;
   an output user logic circuit for receiving an output data signal supplied from the external data output terminal and operating to generate a user output signal;
   an output register for storing the user output signal;
   a fifth scan path connected to the output register; and
   a test control unit for setting the test input signal in the input register and the holding unit through the third and fourth scan paths, respectively, operating the input user logic circuit, the storage unit, and the output user logic circuit, receiving the input data signal stored in the holding unit and the user output signal stored in the output register through the fourth and fifth scan paths, respectively, and comparing the received signals with expected values in the test mode.

8. The circuit according to claim 1, wherein the data input unit receives the input data signal in synchronization with a clock signal, and
   wherein the storage unit outputs, asynchronously with the clock signal, the input data signal to the data output unit after starting operation in response to the output request signal, and
   wherein the timing generating unit has a delay circuit for delaying the output request signal and outputting the delayed output request signal as the timing signal.

9. A method for testing a semiconductor integrated circuit including a data input unit for receiving an input data signal to be supplied to an external data input terminal, a storage unit for storing the input data signal received by the data input unit, a timing generating unit for generating a timing signal in response to an output request signal, a function block having a data output unit for outputting, in synchronization with the timing signal, the input data signal stored in the storage unit as an output data signal, and an output user logic circuit for operating after receiving the output data signal supplied from an external data output terminal, the method comprising:
   masking the output data signal supplied from the data output unit;
   outputting, in synchronization with the timing signal, the input data signal received by the data input unit to the external data output terminal;
   comparing a user output signal supplied from the output user logic circuit with an expected value; and
   detecting a defect of the output user logic circuit.

10. The method according to claim 9, the semiconductor integrated circuit further including an input user logic circuit for receiving a signal supplied from an input register connected to a first scan path, operating to generate an input data signal, and outputting the generated input data signal to the external data input terminal, a holding unit that is provided in the data input unit, is connected to a second scan path, and stores the input data signal, and an output register that is connected to a third scan path and stores the user output signal supplied from the output user logic circuit, the method further comprising:
   setting a test input signal in the input register and the holding unit through the first and second scan paths, respectively;
   operating the input user logic circuit in accordance with the test input signal set in the input register;
   operating the storage unit in accordance with the test input signal set in the holding unit;
   operating the output user logic circuit in accordance with the output data signal supplied from the external data output terminal;

storing the input data signal supplied from the input user logic circuit in the holding unit;
storing the user output signal supplied from the output user logic circuit in the output register; and
detecting a defect of the input user logic circuit and a detect of the output user logic circuit by comparing the input data signal stored in the holding unit and the user output signal stored in the output register with respective expected values.

* * * * *